(12) United States Patent
Lee et al.

(10) Patent No.: US 10,931,250 B2
(45) Date of Patent: Feb. 23, 2021

(54) MODULAR SIGNAL CONVERSION APPARATUS AND METHOD

(71) Applicant: DREAMUS COMPANY, Seoul (KR)

(72) Inventors: Jeong Ho Lee, Gwacheon (KR); Seung Ho Yu, Incheon (KR); Ji Heon Ahn, Yongin (KR); Woo Suk Kim, Bucheon (KR)

(73) Assignee: DREAMUS COMPANY, Seoul (KR)

( * ) Notice: Subject to any disclaimer, the term of this patent is extended or adjusted under 35 U.S.C. 154(b) by 0 days.

(21) Appl. No.: 16/603,160

(22) PCT Filed: May 25, 2017

(86) PCT No.: PCT/KR2017/005461
§ 371 (c)(1),
(2) Date: Oct. 4, 2019

(87) PCT Pub. No.: WO2018/186524
PCT Pub. Date: Oct. 11, 2018

(65) Prior Publication Data
US 2020/0196052 A1 Jun. 18, 2020

(30) Foreign Application Priority Data

Apr. 7, 2017 (KR) .................. 10-2017-0045406
Apr. 28, 2017 (KR) .................. 10-2017-0055705

(51) Int. Cl.
| H04R 3/00 | (2006.01) |
| H03G 3/34 | (2006.01) |
| G06F 3/16 | (2006.01) |
| H03G 3/30 | (2006.01) |
| H03F 3/185 | (2006.01) |

(Continued)

(52) U.S. Cl.
CPC ............ *H03G 3/341* (2013.01); *G06F 3/165* (2013.01); *H03F 3/183* (2013.01); *H03F 3/185* (2013.01);
(Continued)

(58) Field of Classification Search
CPC ........ H04R 2420/09; H04R 3/00; H04R 5/04; H04R 1/1041; H01R 31/06;
(Continued)

(56) References Cited

U.S. PATENT DOCUMENTS

2004/0115994 A1* 6/2004 Wulff ................ H01R 13/2471
439/700
2006/0206320 A1 9/2006 Li
(Continued)

FOREIGN PATENT DOCUMENTS

KR 100363861 B1 12/2002
KR 20060082908 A * 7/2006
(Continued)

OTHER PUBLICATIONS

International Search Report dated Dec. 28, 2017 for PCT Application No. PCT/KR2017/005461.

*Primary Examiner* — Kile O Blair

(57) ABSTRACT

The present invention is a modular signal converting apparatus and method, and particularly, discloses a signal converting apparatus, which is modularized for playback of digital contents and is usable while being combined with another electric device.

17 Claims, 18 Drawing Sheets

(51) Int. Cl.
  *H03F 3/183* (2006.01)
  *H03M 1/66* (2006.01)
  *H04R 3/14* (2006.01)
  *H05K 1/18* (2006.01)
  *H03F 3/68* (2006.01)
  *H03F 3/21* (2006.01)

(52) U.S. Cl.
  CPC ........... *H03G 3/3089* (2013.01); *H03G 3/344* (2013.01); *H03G 3/348* (2013.01); *H03M 1/66* (2013.01); *H04R 3/00* (2013.01); *H04R 3/14* (2013.01); *H05K 1/181* (2013.01); *H03F 3/21* (2013.01); *H03F 3/68* (2013.01); *H03F 2200/03* (2013.01); *H05K 2201/10083* (2013.01)

(58) Field of Classification Search
  CPC .............. H01R 13/2421; H01R 13/506; H01R 13/625; G06F 13/385; G06F 3/162; H01Q 1/2283; H04M 1/6058
  See application file for complete search history.

(56) References Cited

U.S. PATENT DOCUMENTS

| | | | | |
|---|---|---|---|---|
| 2008/0232611 | A1* | 9/2008 | Filipovic | H04B 15/06 381/94.3 |
| 2009/0180644 | A1* | 7/2009 | Jiang | H04R 3/00 381/120 |
| 2012/0083137 | A1* | 4/2012 | Rohrbach | H01R 13/6205 439/39 |
| 2013/0266154 | A1* | 10/2013 | McCormack | H04R 3/00 381/117 |
| 2017/0351479 | A1* | 12/2017 | Trejo | G06F 3/162 |

FOREIGN PATENT DOCUMENTS

| | | |
|---|---|---|
| KR | 1020060082908 A | 7/2006 |
| KR | 1020080072584 A | 8/2008 |
| KR | 101126615 B1 * | 3/2012 |
| KR | 101126615 B1 | 3/2012 |

\* cited by examiner

[FIG. 1]
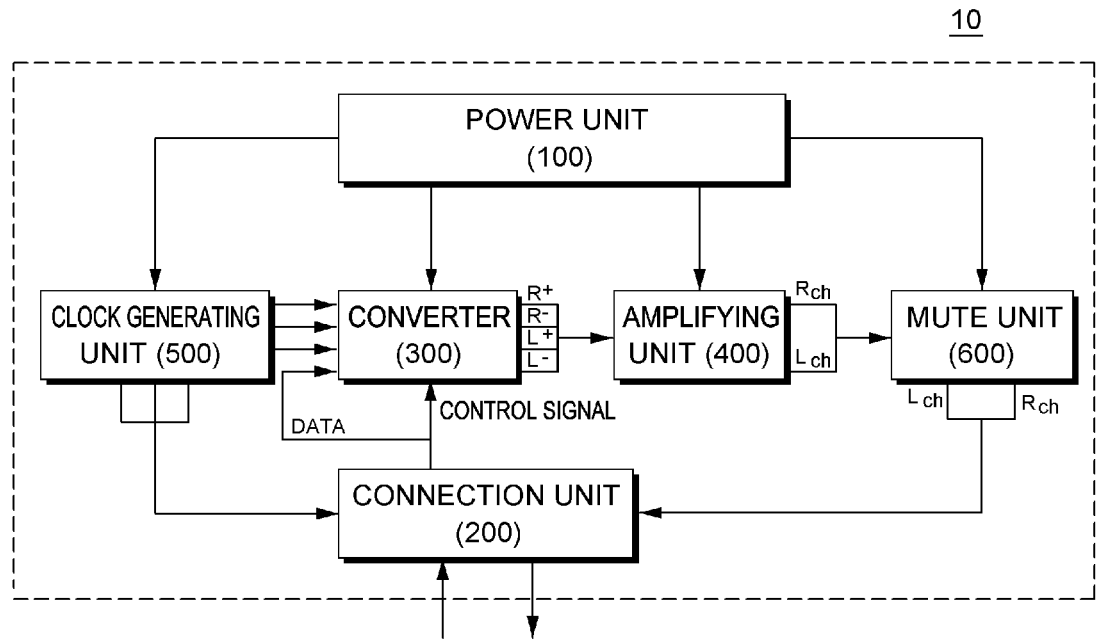
[FIG. 2]
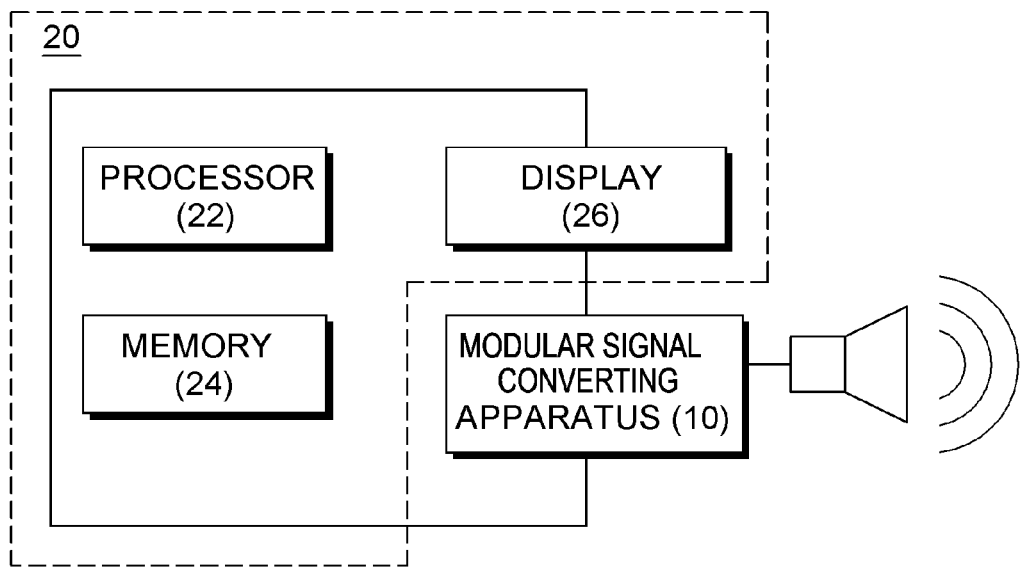

[FIG. 3]
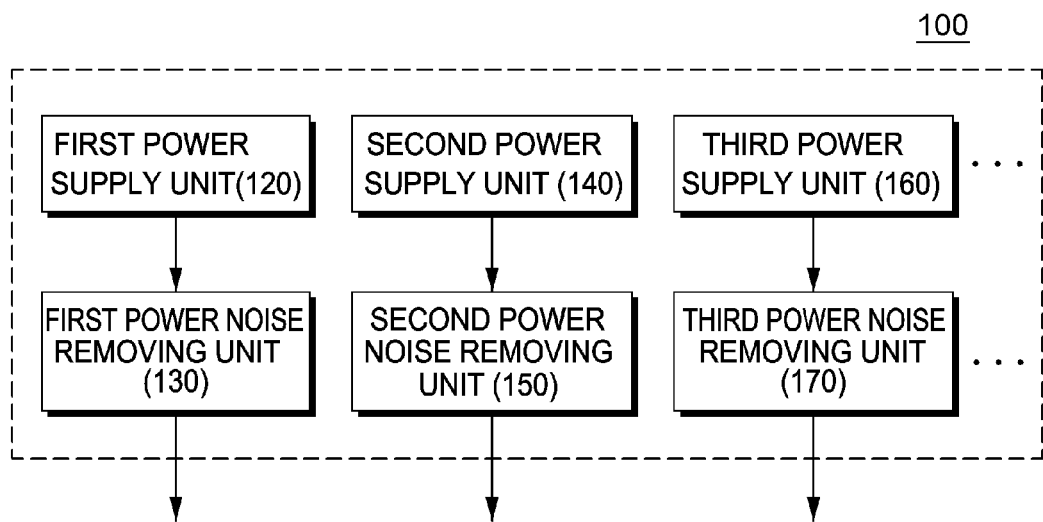
[FIG. 4]
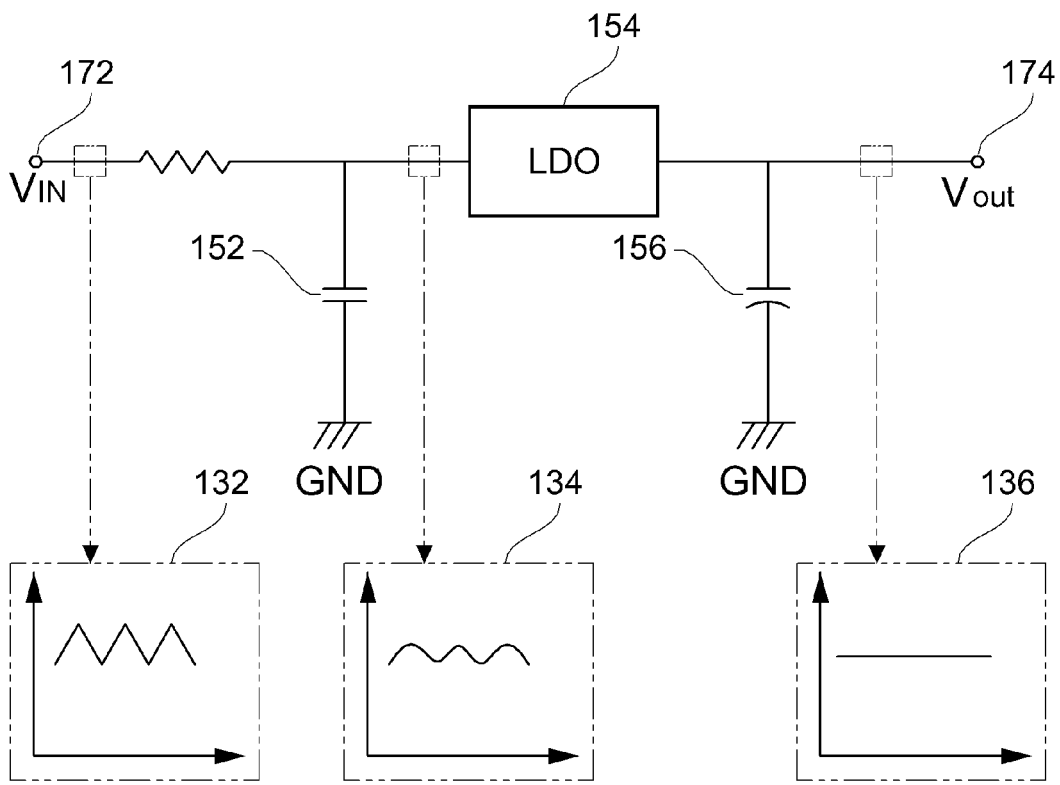

[FIG. 5]
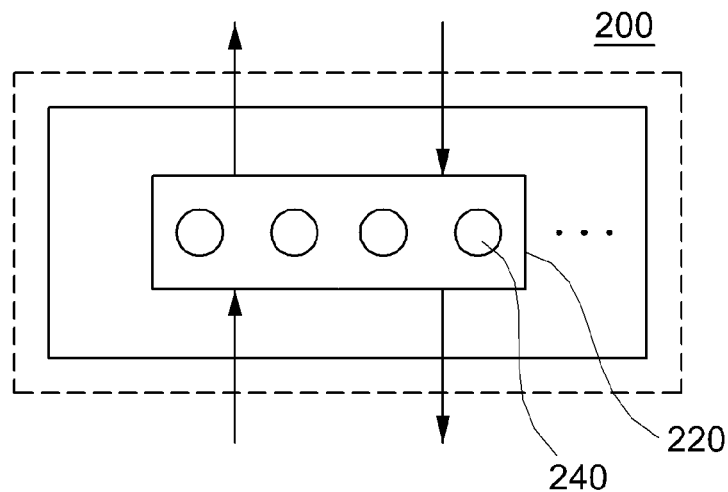
[FIG. 6]
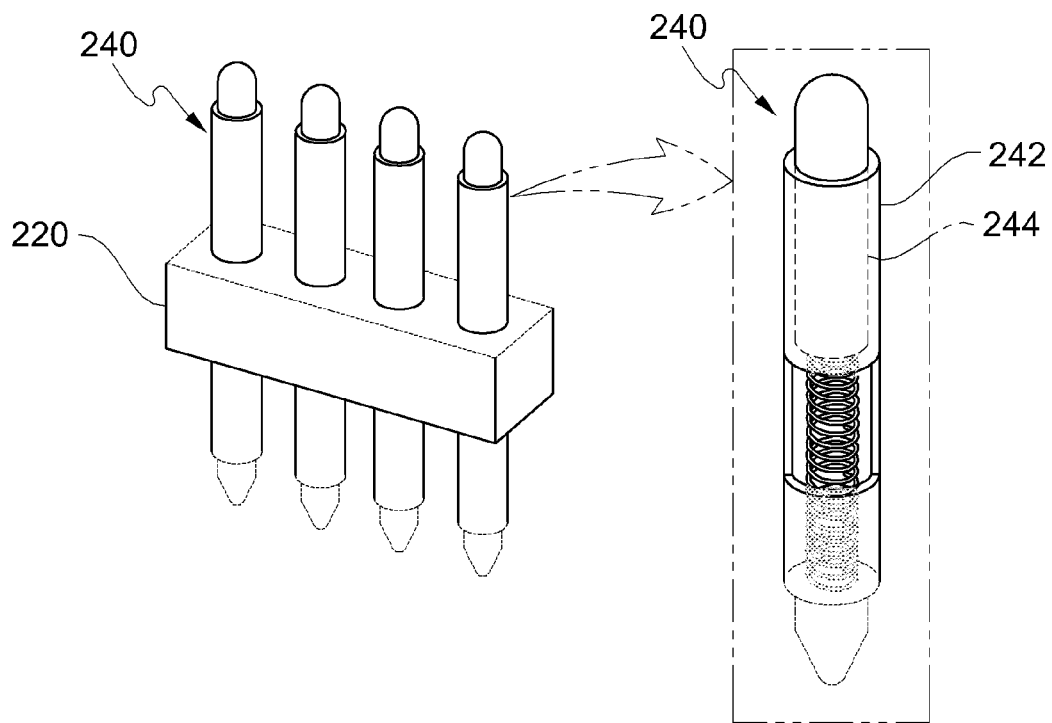

[FIG. 7]
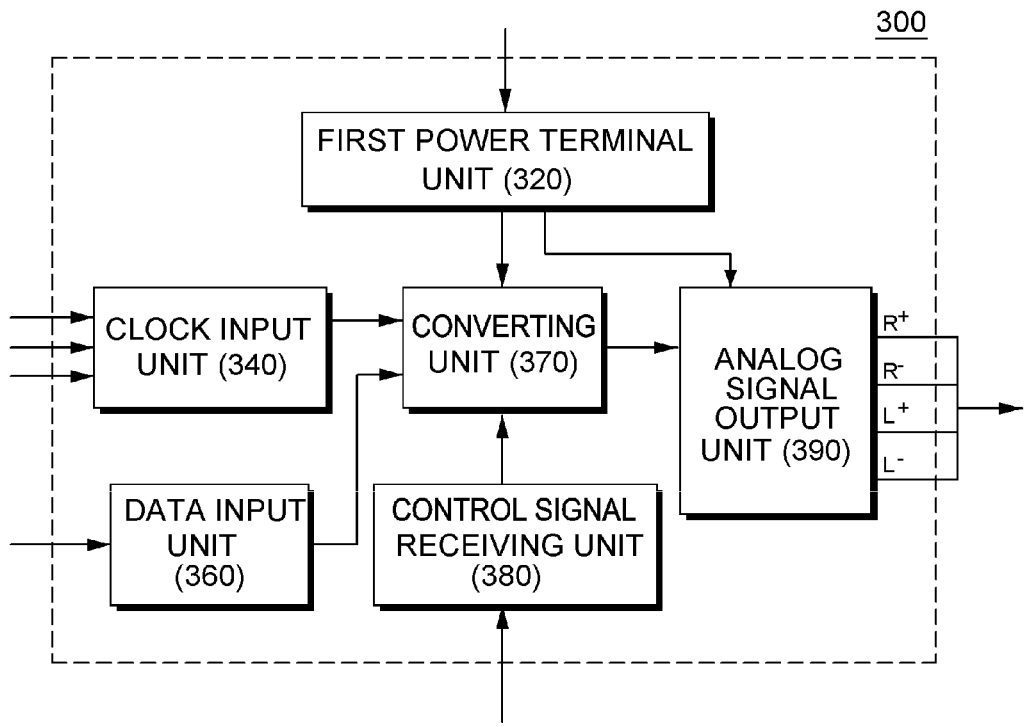
[FIG. 8]
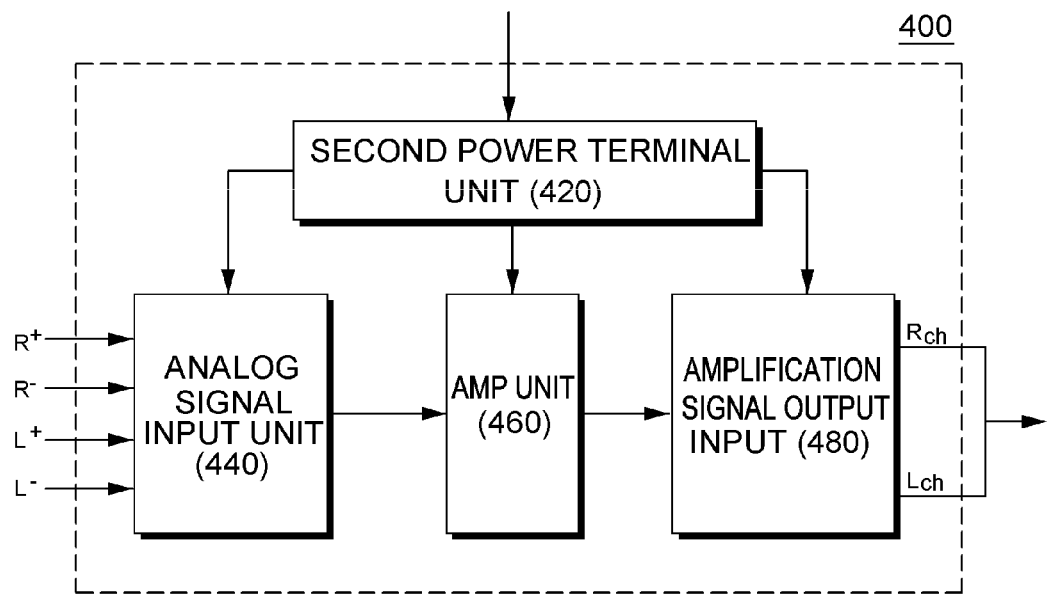

[FIG. 9]
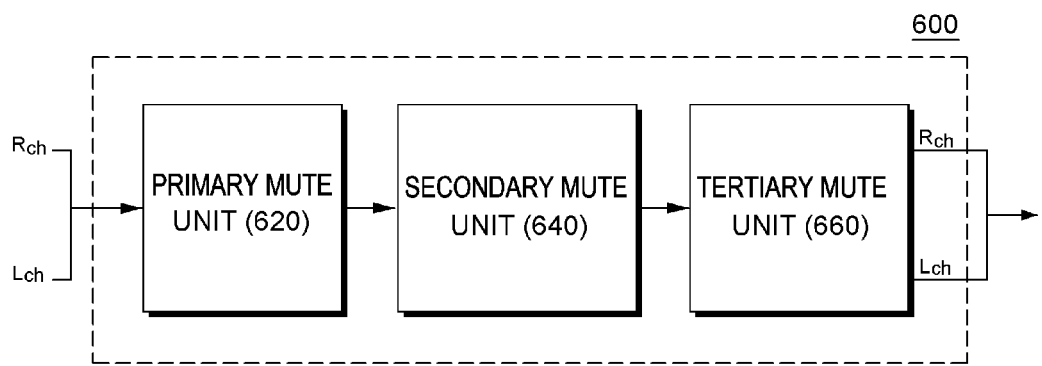
[FIG. 10]
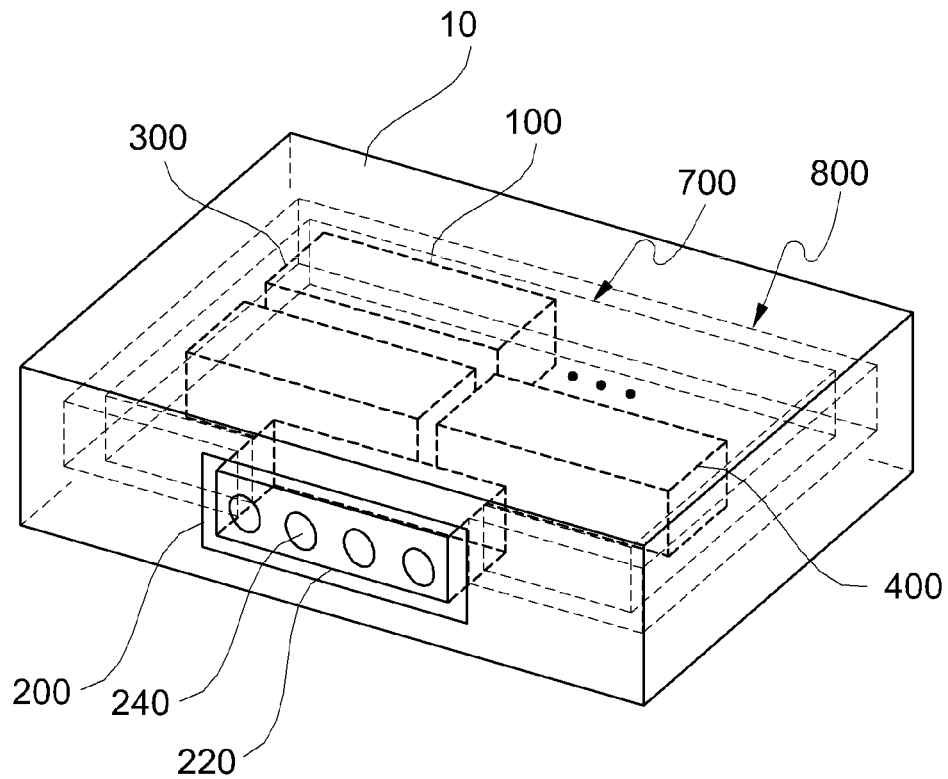

[FIG. 11]
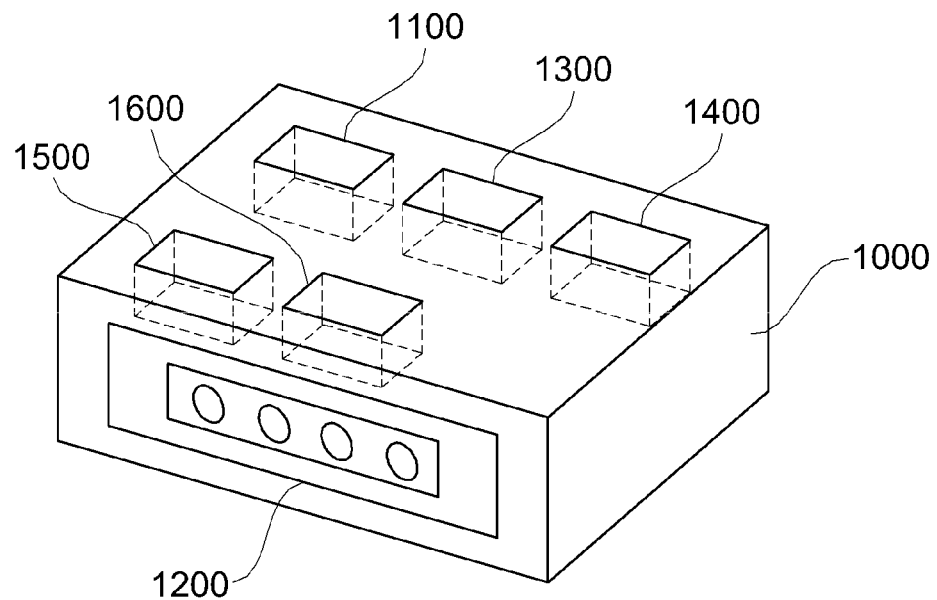
[FIG. 12]
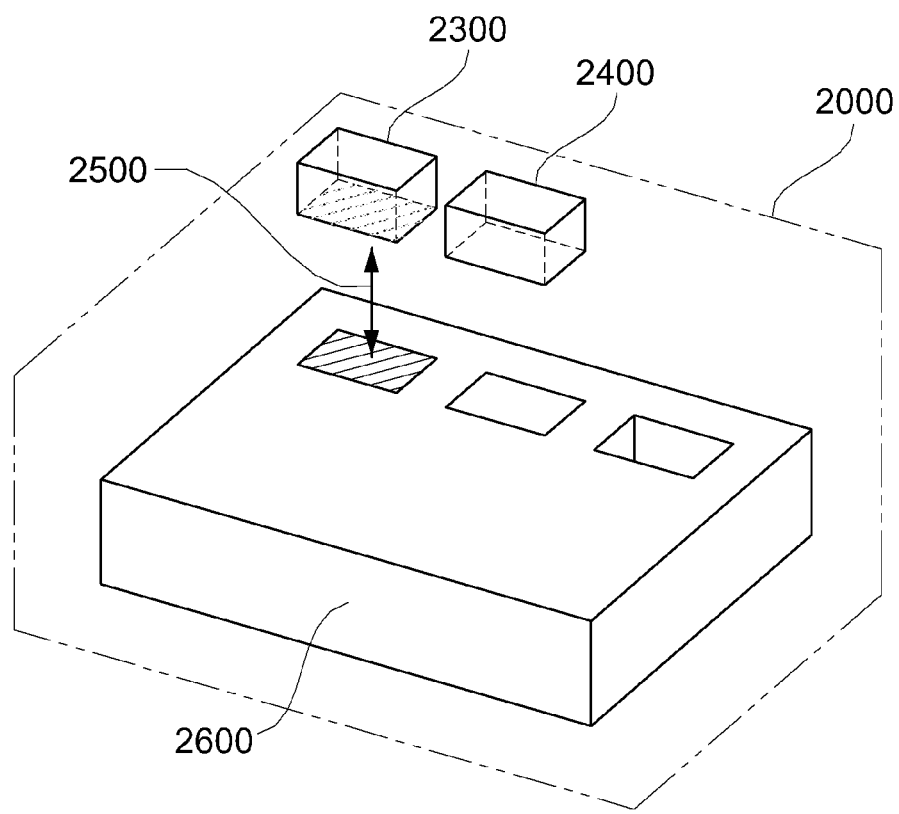

[FIG. 13]
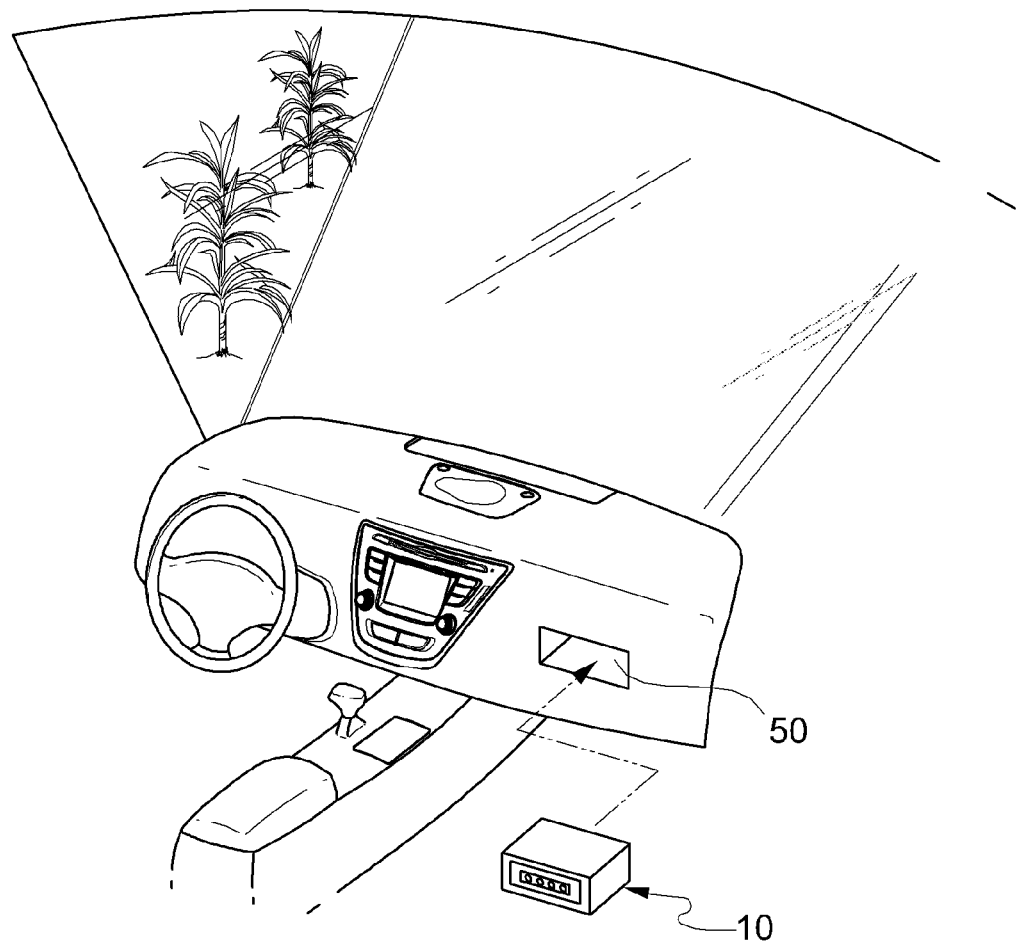

[FIG. 14]
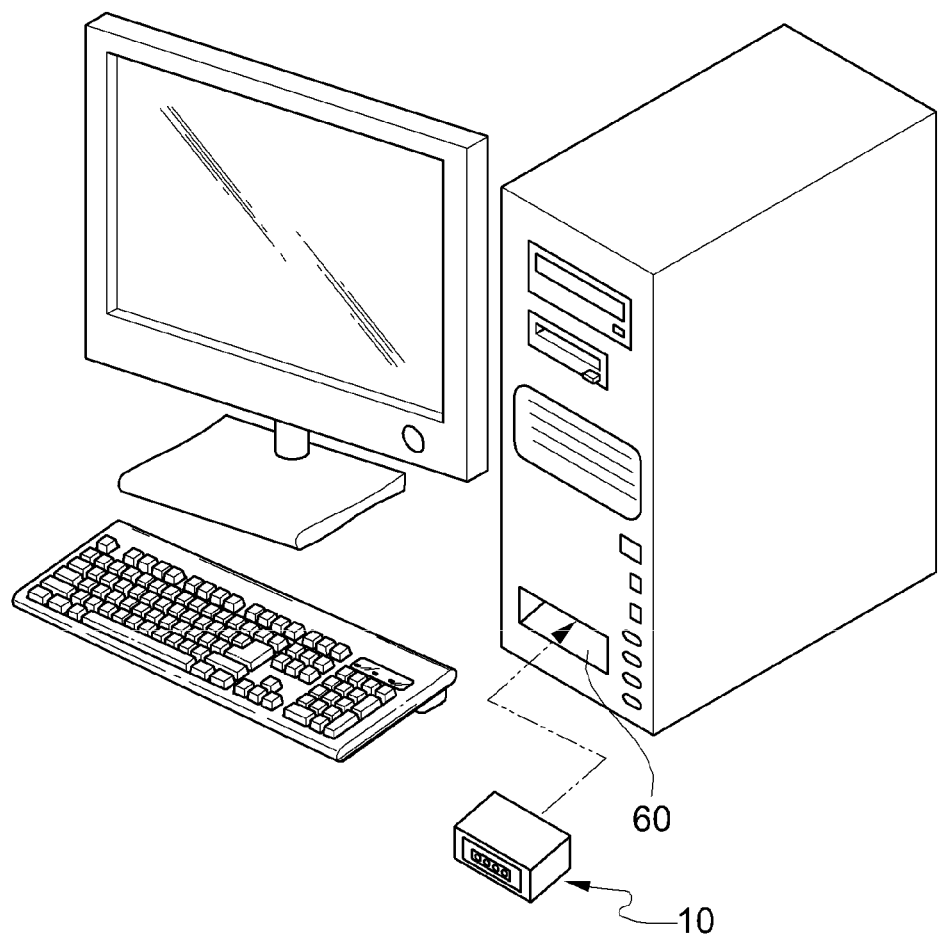

[FIG. 15]
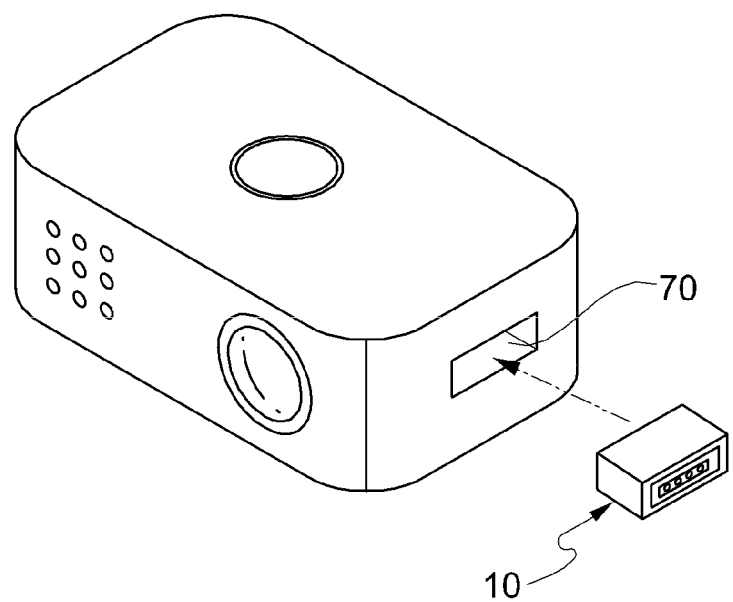

[FIG. 16]
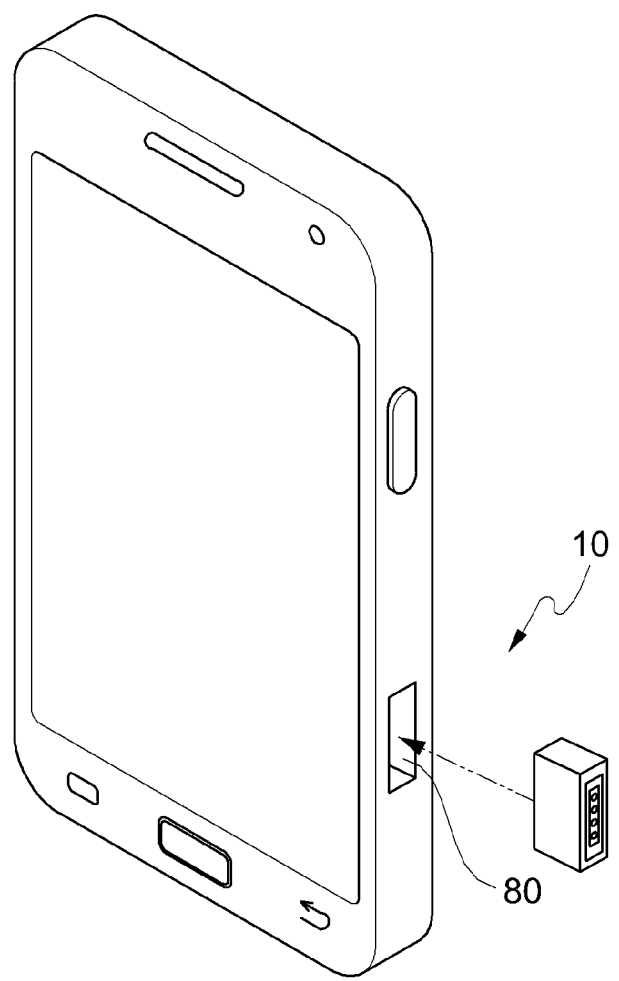

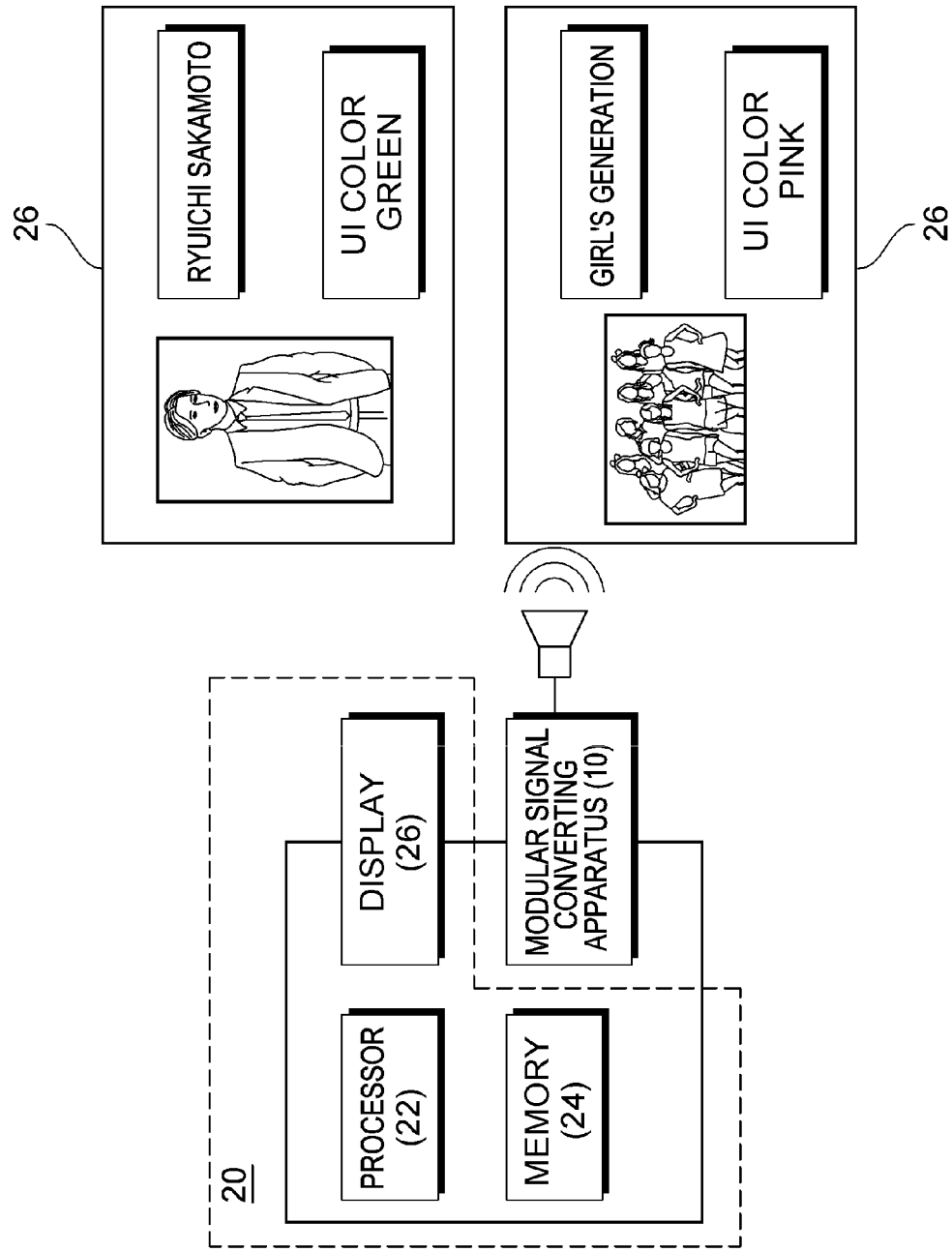

[FIG. 18]
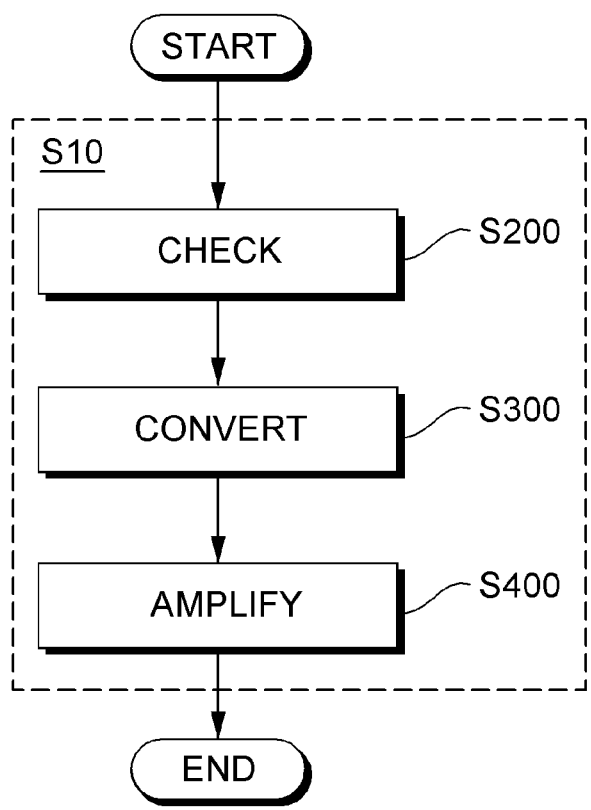

[FIG. 19]
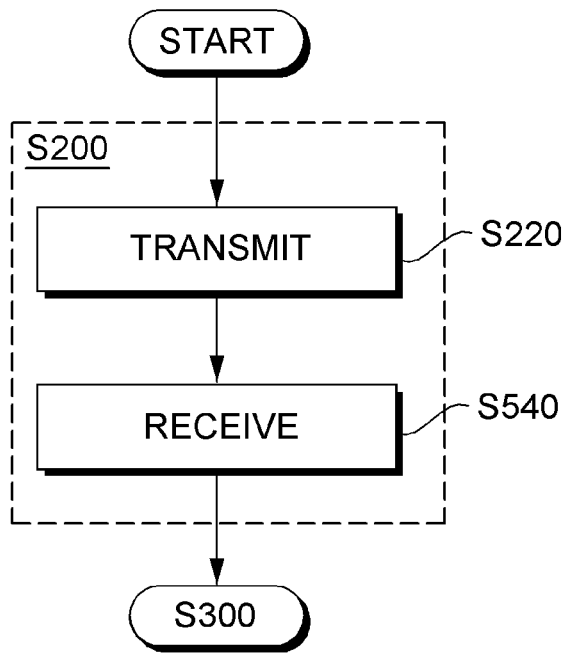

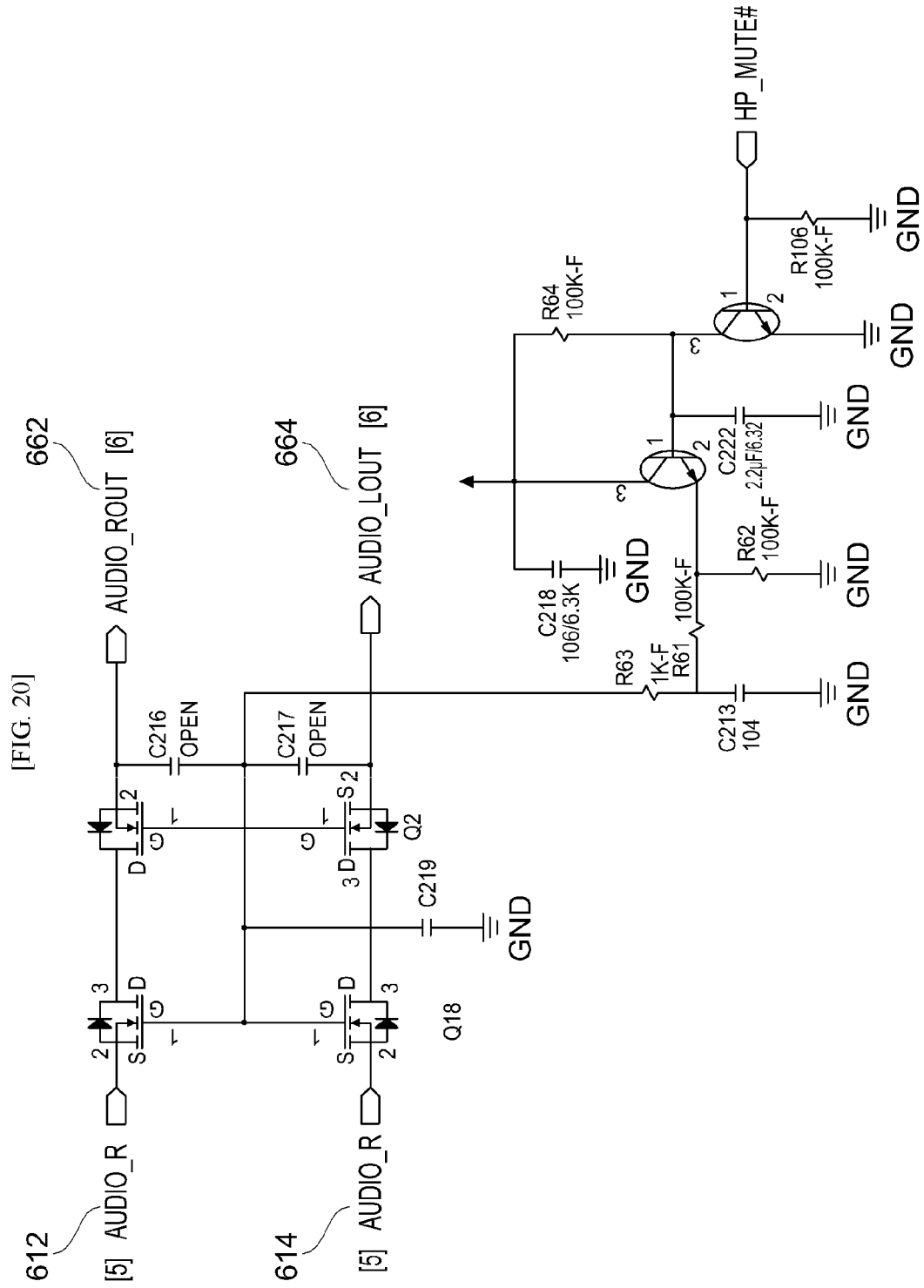
[FIG. 20]

[FIG. 21]
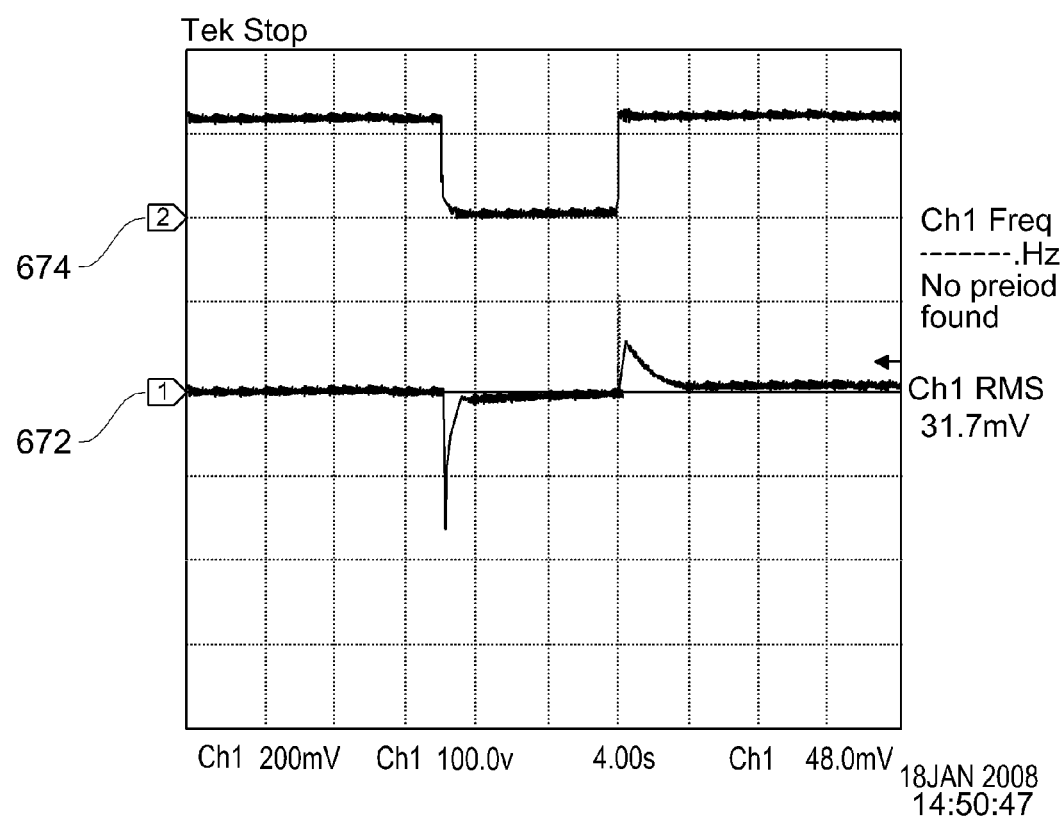

[FIG. 22]
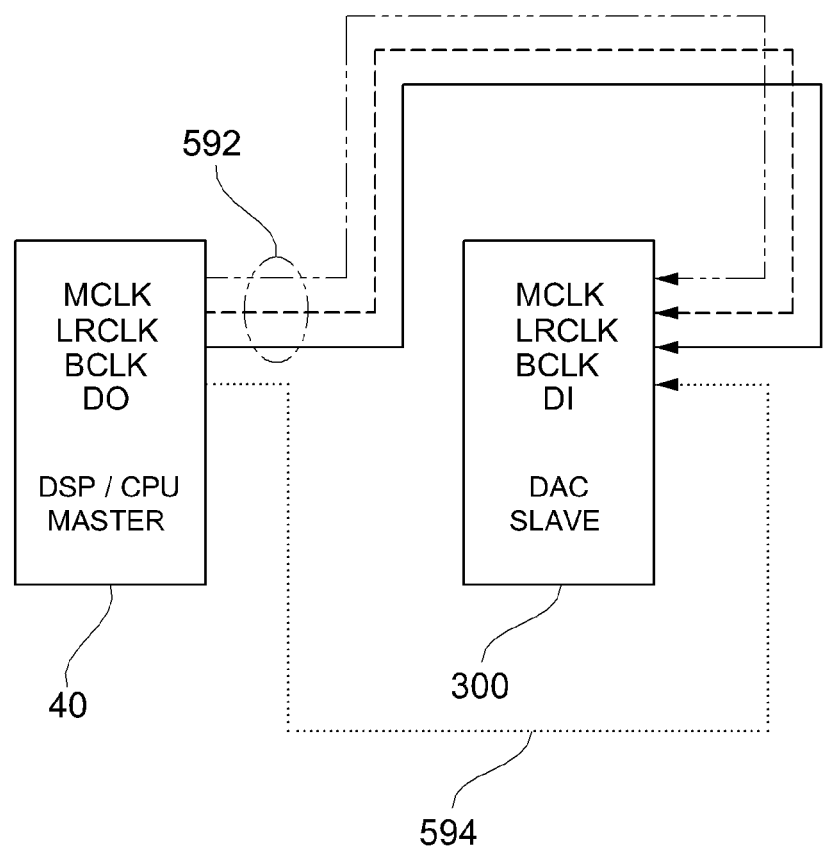

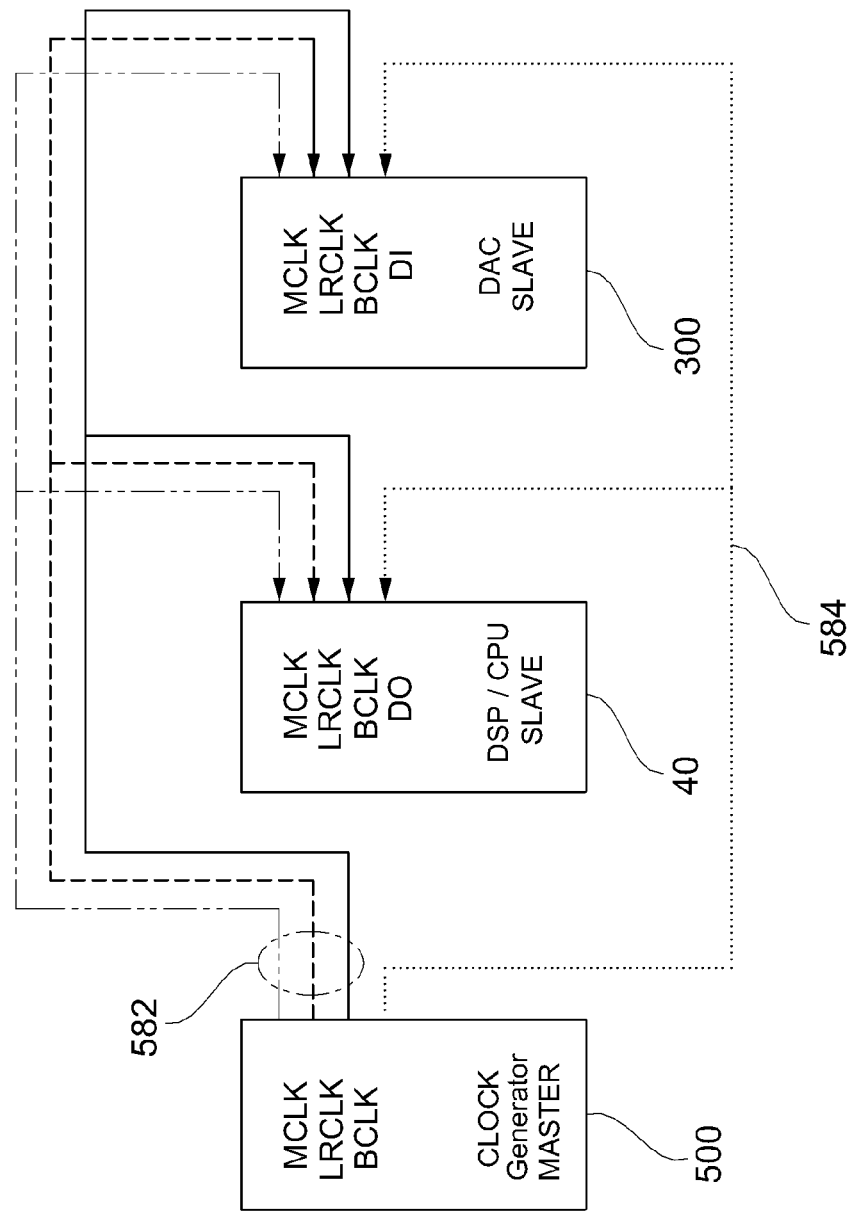
[FIG. 23]

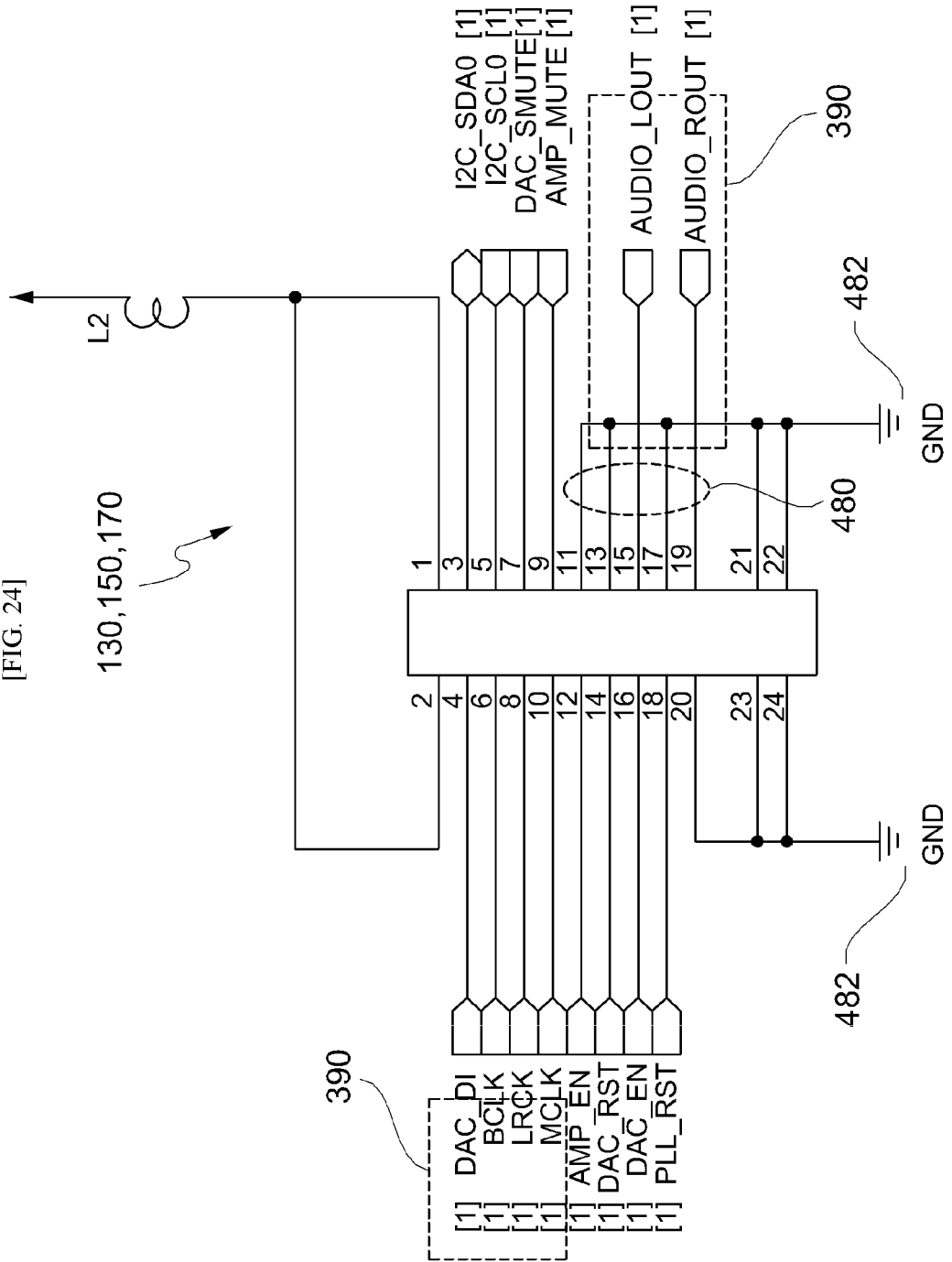
[FIG. 24]

MODULAR SIGNAL CONVERSION APPARATUS AND METHOD

CROSS-REFERENCE TO RELATED APPLICATIONS

This application is a national stage application, filed under 35 U.S.C. § 371, of International Patent Application No. PCT/KR2017/005461, filed on May 25, 2017, which claims priority to and the benefit of Korean Patent Application No. 10-2017-0045406 filed in the Korean Intellectual Property Office on Apr. 7, 2017, Korean Patent Application No. 10-2017-0055705 filed in the Korean Intellectual Property Office on Apr. 28, 2017, the entire contents of which are incorporated herein by reference.

TECHNICAL FIELD

The present invention relates to an apparatus and a method of converting a signal.

BACKGROUND ART

A digital signal converting apparatus in the related art has a structure in which separate cases having sub-functions required for performing the conversion are combined, so that there is a disadvantage in that a volume of an entire system is increased and manufacturing cost is increased due to the structure. Further, manual processes are increased in production and assembly processes, so that there are disadvantages in that labor cost is increased and a manufacturing period is long, and there are many restrictions on transportation. The foregoing disadvantages cause a lot of waste in manpower and time and the digital signal converting apparatus is aesthetically unappealing. Further, the separate cases having the respective functions of the digital signal converting apparatus are independently used, so that there is no compatibility between the cases which causes an increase in manufacturing cost.

Further, the modularized signal converting apparatus having the foregoing function is not separately manufactured, but is released as a single unit as a finished product, and after a certain period of time, due to the modified format and the development of the technology of additional devices in a compression rate and signal processing, internal devices are incompatible with each other, so that there has been inconvenience of buying the latest digital signal converting apparatus again.

However, in a discrete signal converting apparatus, especially, an audio playback device, a discrete signal converting apparatus in which compatibility between the devices is considered and the entire devices including a power supply unit, an amplifying unit, and a converter required for converting a discrete signal are modularized is absent or incomplete.

Further, in a situation where a manufacturing company and a platform supplier share a specific standard, each of the manufacturing companies has a problem of failing to upgrade the product due to lack of experts in combining components and solutions of the digital signal converting apparatus, and there is a problem in that there is difficulty in a license support of a company having a technology of a specific digital signal converting apparatus or playback apparatus.

Accordingly, in the related art, there is a demand for developing a technology in which after a customer or a manufacturing company buys components of an audio device having only a base, a user buys the remaining units according to taste and purpose of the user and easily attaches/detaches the units, and a solution which is easy to anyone and is variously applicable is also demanded.

DISCLOSURE

Technical Problem

The present invention is conceived to solve the foregoing problems, and the present invention is related to an apparatus and a method of converting a signal, which are applicable to a digital audio playback device for reproducing a sound source signal. The present specification discloses a modular signal converting apparatus and method so that a user and a manufacturing company buy a compatible signal converting apparatus, directly mount the signal converting apparatus to an electrically contactable external electronic device, such as a computer and an audio system for a vehicle, and select a signal having a quality that suits user's taste and purpose.

Further, an object of the present invention is to provide a solution for simply upgrading hardware according to mass-production and release of the convertible compatible components according to the technology development.

Technical Solution

The present invention is conceived to achieve the objects, and provides a modular signal converting apparatus which is combinable with an external electric circuit, the modular signal converting apparatus including: a power unit configured to supply power; a connection unit which is in electric contact with the external electric circuit; a converter configured to receive power from the power unit and convert a discrete signal transferred from the connection unit to an analog signal; and an amplifying unit configured to amplify the analog signal converted by the converter.

In the present invention, the connection unit may include: an electrode for an electric contact with the external electric circuit; and a fastening part for a mechanical combination with the electric circuit.

In the present invention, the modular signal converting apparatus may further include a housing which is located outside the power unit, the converter, and the amplifying unit and surrounds the power unit, the converter, and the amplifying unit, in which the housing may be provided so as to expose at least a part of the connection unit to the outside.

The fastening part may be provided to be detachable from the external electric circuit by using magnetic force, and the housing may be located outside the power unit, the converter, and the amplifying unit and surround the power unit, the converter, and the amplifying unit, and may be provided so as to expose at least a part of the electrode to the outside.

The electrode may have a pin structure including a guide shaft operated with a spring and a guide ball transferring an electric signal into the guide shaft, and when the electrode is pressurized with force larger than elastic force of the spring, the guide ball may be in contact with the electric circuit.

The power unit may include: a plurality of separated power supply units; and a plurality of separated noise removing units, which is connected to the separated power supply units, and has a structure in which electric elements for removing noise in stages are sequentially disposed, and the power unit may block noise induced from the power supply unit through the noise removing unit and supplies power.

The converter may convert the discrete signal to the analog signal by using synchronized control signal and clock signals from an external processor.

The converter may have a Sony Philips Digital Interface (S/PDIF) structure in which the clock signal and the discrete signal transferred from the connection unit are received through one cable, and the cable may be at least one of a coaxial cable or an optical fiber cable. In the present invention, the converter may convert the discrete signal to the analog signal through the SPDIF structure.

In the converter, an internal circuit wiring gap may have a spaced structure having a predetermined distance or more in order to prevent a digital signal and an analog signal from overlapping.

In the present exemplary embodiment, the modular signal converting apparatus may include a shield can which is located outside the power unit, the converter, the amplifying unit, and the housing and surrounds the power unit, the converter, the amplifying unit, and the housing in order to prevent an inflow of radiated noise, and a material of the shield can may include at least one of nickel silver or stainless.

The amplifying unit may include a plurality of output channels, and an internal circuit of the output channel may have a structure in which each output channel is surrounded with a ground in order to reduce a signal interference phenomenon between the output channels.

Each of the amplifying unit and the converter may include a filter for blocking noise generated in the power unit.

In the present exemplary embodiment, the modular signal converting apparatus may include a clock generating unit configured to generate a clock signal determining operation timing of the modular signal converting apparatus, in which the clock signal generated by the clock generating unit may be input to a processor of the external electric circuit and the converter of the modular signal converting apparatus.

In the present exemplary embodiment, the modular signal converting apparatus may include a mute unit configured to adjust an output of the modular signal converting apparatus.

Further, in order to achieve the objects, the present invention provides a modular signal converting method, including: receiving power from a power unit inside a modular signal converting apparatus; checking whether the modular signal converting apparatus is in electric contact with an external electric circuit; receiving, by the modular signal converting apparatus, a discrete signal transferred from the external electric circuit and converting the discrete signal into an analog signal; and amplifying the analog signal.

The checking may include, in the case where the modular signal converting apparatus is in normal contact with the external electric circuit, transmitting a contact signal informing that the modular signal converting apparatus is ready to receive the discrete signal to the external electric circuit.

When the external electric circuit receives the contact signal, the external electric circuit may transmit the discrete signal to the modular signal converting apparatus.

The converting may further include receiving a synchronized control signal and a clock signal from the external electric circuit, and the modular signal converting apparatus may convert the discrete signal to the analog signal by using the synchronized control signal and the clock signal.

The converting and the amplifying may further include receiving power from a power unit inside the modular signal converting apparatus, and the receiving of the power may include receiving power by removing noise induced from the power unit.

The converting may include converting the discrete signal by using an internal circuit in which a wiring gap has a spaced structure having a predetermined distance or more, in order to prevent the discrete signal and the analog signal from overlapping.

Further, the present invention discloses a computer program stored in a computer readable recording medium for executing the modular signal converting method in a computer.

Advantageous Effects

According to the present invention, it is possible to change a system, such as change, replacement, and upgrade of a modularized signal processing apparatus, according to a user's request, through modularization of a digital signal processing apparatus. Further, it is possible to minimize noise generated in a modular apparatus, and obtain a high quality analog signal at low cost.

DESCRIPTION OF DRAWINGS

FIG. 1 is an enlarged block diagram of an internal portion of a modular signal converting apparatus according to an exemplary embodiment of the present invention.

FIG. 2 is a diagram of an example of an application of the modular signal converting apparatus coupled to an electrically contactable external electric circuit according to the exemplary embodiment of the present invention.

FIG. 3 is an enlarged block diagram of a power supply unit in the exemplary embodiment of FIG. 1.

FIG. 4 is a circuit diagram of a noise removing unit in which electric devices located inside the power supply unit are sequentially disposed in the exemplary embodiment of FIG. 1.

FIG. 5 is a conceptual diagram of a connection unit in the exemplary embodiment of FIG. 1.

FIG. 6 is a diagram of an example of a fastening unit and an electrode in the exemplary embodiment of FIG. 1.

FIG. 7 is an enlarged block diagram of a converter in the exemplary embodiment of FIG. 1.

FIG. 8 is an enlarged block diagram of an amplifying unit in the exemplary embodiment of FIG. 1.

FIG. 9 is an enlarged block diagram of a mute unit in the exemplary embodiment of FIG. 1.

FIG. 10 is a diagram of an example of a housing and a shield can inside the modular signal converting apparatus according to the exemplary embodiment of the present invention.

FIG. 11 is a conceptual diagram illustrating an external appearance of a modular signal converting apparatus according to an exemplary embodiment of the present invention.

FIG. 12 is a conceptual diagram for modularization of devices inside a modular signal converting apparatus according to an exemplary embodiment of the present invention.

FIG. 13 is a conceptual diagram illustrating the case where the modular signal converting apparatus according to the exemplary embodiment of the present invention is in contact with an electric circuit inside an electronic component of a vehicle.

FIG. 14 is a conceptual diagram illustrating the case where the modular signal converting apparatus according to the exemplary embodiment of the present invention is mounted to an electric circuit within a computer device.

FIG. 15 is a conceptual diagram illustrating the case where the modular signal converting apparatus according to the exemplary embodiment of the present invention is mounted to an electric circuit within a video device.

FIG. 16 is a conceptual diagram illustrating the case where the modular signal converting apparatus according to the exemplary embodiment of the present invention is mounted to an electric circuit within a mobile device.

FIG. 17 is a conceptual diagram of a user interface and graphic user interface (UI/GUI) which is changeable while being in linkage with the modular signal converting apparatus according to the exemplary embodiment of the present invention.

FIG. 18 is a flowchart of a modular signal converting method according to an exemplary embodiment of the present invention.

FIG. 19 is an enlarged flowchart of an operation of checking in the exemplary embodiment of FIG. 18.

FIG. 20 is a diagram of an example for a circuit structure of the mute unit according to the exemplary embodiment of the present invention.

FIG. 21 is a diagram of a measurement of intensity of POP noise removed in the mute unit.

FIG. 22 is a conceptual diagram for synchronization by using a clock signal and a control signal of a processor according to the exemplary embodiment of the present invention.

FIG. 23 is a conceptual diagram for a synchronization method of a clock signal and a control signal by using an internal phased lock loop according to the exemplary embodiment of the present invention.

FIG. 24 is an example of a circuit diagram having a structure in which an output channel of the amplifying unit is surrounded with a ground according to the exemplary embodiment of the present invention.

MODE FOR CARRYING OUT THE INVENTION

Hereinafter, exemplary embodiments of the present invention will be described in detail with reference to the accompanying drawings.

In describing the present invention with reference to the accompanying drawings, the same or corresponding constituent elements are denoted by the same reference numerals, and repeated description thereof will be omitted.

Further, in describing the present invention, a detailed description of known configurations or functions incorporated herein will be omitted when it is judged that the detailed description may make the subject matter of the present disclosure unclear.

Terms used in the present application are used only to describe specific exemplary embodiments, and are not intended to limit the present invention. Singular expressions used herein include plural expressions unless they have definitely opposite meanings in the context.

Each operation described below may be provided with one or several software modules, or may be implemented with hardware serving each function, and may also be implemented with a combination form of software and hardware.

A particular meaning and an example of each term will be described below in order of each drawing.

Hereinafter, a configuration of an audio playback apparatus according to an exemplary embodiment of the present invention will be described in detail with reference to the relevant drawings.

FIG. 1 is an enlarged block diagram illustrating an internal portion of a modular signal converting apparatus according to an exemplary embodiment of the present invention.

A modular signal converting apparatus 10 includes a power unit 100, a connection unit 200, a converter 300, an amplifying unit 400, a clock generating unit 500, and a mute unit 600.

The modular signal converting apparatus 10 is a set of devices for converting the signal performing a predetermined function, and is in electrical contact with an external communicable electric circuit and performs a signal converting function.

In the exemplary embodiment, the modular signal converting apparatus 10 may be an apparatus which plays digital contents back and outputs a high quality sound source. Further, the modular signal converting apparatus 10 may be used as an electric device, such as a computer 60, a video player 70, and an audio device 50 inside an electronic component for a vehicle having electrically contactable connection units, requiring a conversion of a signal. The modular signal converting apparatus 10 is modularized, so that there is an advantage in that users are capable of easily changing a system, such as changing, replacing, and upgrading a device, according to a demand of the user.

In the exemplary embodiment, the signal converted by the modular signal converting apparatus 10 is a discrete signal, and a quantized signal, especially, a digital signal, and referring to FIGS. 2 and 13, the discrete signal may be transmitted from a storage device within a communicable external electric circuit. Further, the discrete signal may be transmitted in a streaming format on the Internet.

In another exemplary embodiment, when the modular signal converting apparatus 10 serves as an apparatus outputting a high quality sound source, the modular signal converting apparatus 10 may have high current consumption. In this case, it is possible to minimize current consumption according to usage by separately controlling the converter 300 and the amplifying unit 400 of the modular signal converting apparatus 10.

The disposition of the power unit 100, the converter 300, the amplifying unit 400, and the like within the modular signal converting apparatus 10 may be changed according to a purpose of decreasing noise, and the change may affect the quality of a final analog signal, and the positions and a connection relationship between the power unit 100, the converter 300, the amplifying unit 400, and the like within the modular signal converting apparatus 10 may have design structures optimized to a data flow or a signal flow. The disposition and the design of the modular signal converting apparatus 10 may be set by using hardware or software.

In the exemplary embodiment, in the changing of the devices within the modular signal converting apparatus 10, initialization of a flow of data or a signal may be needed, and the initialization may be performed by a module embedded in hardware itself or automatically set by separate software receivable on the Internet or through a mobile application.

The power unit 100 performs a function of supplying electric energy to the converter 300, the amplifying unit 400, the clock generating unit 500, and the mute unit 600 through a physical or chemical action.

In the exemplary embodiment, the power unit 100 may have a circuit structure for decreasing noise when a characteristic in that the power unit 100 is sensitive to noise of a hi-fi audio module is considered, and referring to FIGS. 3 and 4, the power unit 100 may include a plurality of power supply units 120, 140, and 160, and a plurality of noise removing units 130, 150, and 170, and the respective power supply units 120, 140, and 160 may be separated and have optimized predetermined voltage values for decreasing noise.

In another exemplary embodiment, the power unit 100 may be located outside, not inside the modular signal converting apparatus 10, and supply power. Referring to FIGS. 2 and 13, the communicable electric circuit 20 or the electric circuit 50 inside the electronic component of the vehicle may include the power unit, and may supply power when the modular signal converting apparatus 10 is mounted.

In the exemplary embodiment, each of the power supply units 120, 140, and 160 may use a potential difference caused by an ionization difference of a metal, and may include a primary battery which cannot be charged and a chargeable secondary battery. The kind of power supply unit may be changed according to a characteristic of the communicable external electric circuit 20. The electric circuit 50 inside the electronic component of the vehicle may use the power supply unit, such as a storage battery.

The noise removing units 130, 150, and 170 perform functions of removing noise induced by the power unit 100.

In the exemplary embodiment, each of the noise removing units 130, 150, and 170 may have a circuit structure in which electric devices are sequentially connected, and the circuit structure may primarily use a bead for removing high-frequency noise, secondarily use a Low Drop Out (LDO) regulator 154, tertiarily use a capacitor 152 having a lower serial equivalent resistance value, and quaternarily use a high-capacity capacitor 156.

The LDO regulator 154 linearly adjusts a voltage even when a supply voltage is very close to an output voltage, and has little voltage drop and small ripples, so that there are advantages in that noise is decreased, a circuit is simple, and a price is low.

Referring to FIGS. 5 and 6, the connection unit 200 includes a fastening unit 220 and electrodes 240. In the exemplary embodiment, the connection unit 200 enables the modular signal converting apparatus 10 to be electrically and mechanically connected with the communicable external electric circuit 20 and serves as a passage of an electric signal. Further, the connection unit 200 may receive a discrete signal from the communicable external electric circuit 20 and transmit the input discrete signal to a data input unit 360 of the converter 300, and may include an insulating material in order to prevent an electric signal from flowing in the air or in a body of a user.

The fastening unit 220 enables the modular signal converting apparatus 10 to be mechanically mounted to the communicable external electric circuit 20.

In the exemplary embodiment, the fastening unit 220 may include a connector having a standardized standard, and may have a fastening structure using magnetic force for convenience of a user. Further, the fastening unit 220 may have a detachable fastening structure which the general electronic devices have, and a material of the fastening unit 220 may include an insulating material for preventing an electric signal from leaking.

The electrode 240 may be a passage of an electric signal between the modular signal converting apparatus 10 and the external electric circuit 20. This will be described with reference to FIGS. 10, 11, and 12.

In the exemplary embodiment, the electrode 240 may be a passage of a discrete signal, a contact signal, and clock signals 582 and 592. The electrode 240 may have a pin structure including a guide shaft 242 operated with a spring and a guide ball 244 which is capable of transferring an electric signal to an internal side of the guide shaft. When the electrode 240 is pressurized with larger force than elastic force of the spring, the guide ball 244 may be in contact with the electric circuit, and the structure of the electrode 240 may have the similar form to a POGO PIN structure.

The converter 300 includes a first power terminal unit 320, a clock input unit 340, a control signal receiving unit 380, a synchronization device, a data input unit 360, a converting unit 370, and an analog signal output unit 390.

Referring to FIGS. 7, 22, and 23, the converter 300 converts a discrete signal input from the communicable external electric circuit 20 to an analog signal by using the synchronized control signals 584 and 594 and the clock signals 582 and 592 and outputs the analog signal.

In the exemplary embodiment, the converter 300 may include the plurality of converters 300, and when the plurality of converters 300 is used, the converter 300 may convert a discrete signal to a high quality analog signal through equalization of output noise. When the plurality of converters 300 is used, current consumption may be increased, which, however, may be solved by individually controlling the currents of the converters 300.

In another exemplary embodiment, the converter 300 may have a spaced structure in order to prevent overlapping of portions in which digital noise may be induced on the internal circuit pattern. In the spaced structure, the spaced structure may be spaced on a two-dimensional plane or may be spatially spaced on different layers in a three-dimensional space. The spaced distance has a predetermined value or larger in consideration of a size and a playback sound quality of a final digital signal device.

The synchronization is performed by matching operation timing of the modular signal converting apparatus 10 and the communicable external electric circuit 20 and unifying reference times of the clock signals 582 and 592. The synchronization may mean not only matching the operation timing between the devices, but also data matching.

The first power terminal unit 320 receives power from the power unit 100.

The clock input unit 340 receives the clock signals 582 and 592 generated in the clock generating unit 500.

In the exemplary embodiment, the clock signals 582 and 592 input to the clock input unit 340 may include a Master Clock (MCLK), a Left-Right Clock (LRCK), and a Bit Clock (BITCLK). The MCLK is a master clock and determines final operation timing of the modular signal converting apparatus. The LRCK is a clock for a left (L) channel and a right (R) channel of a digital audio signal. The BITCLK is a clock that is transmitted by interlocking with a bit that is the basis of a digital signal, and whether a digital signal is 0 or 1 is determined by synchronizing with the bit clock.

The control signal receiving unit 380 performs a function of receiving the synchronized control signals 584 and 594 of an external processor. The external processor 20 detects abnormality of the clock generating unit and when the abnormality is generated, the external processor 20 initializes the clock generating unit. When the abnormality is generated even after the initialization of the clock generating unit, the external processor 20 generates a control signal for terminating an operation of the clock generating unit 100.

The data input unit 360 receives a discrete signal from the communicable external electric circuit 20. The discrete signal received from the data input unit 360 is converted to an analog signal, is amplified through the amplifying unit 400, and is output.

In the exemplary embodiment, the clock input unit 340 and the data input unit 360 may have a Sony Philips Digital Interface (S/PDIF) structure. The S/PDIF is a digital interface, and means a connector transceiving a discrete signal between electronic devices. The S/PDIF digital interface may have a coaxial cable scheme or an optical cable scheme. When the S/PDIF is used, signals of four digital lines may be made with one digital line, and it is possible to obtain an effect of decreasing digital noise.

The converting unit 370 converts a discrete signal to an analog signal and outputs the analog signal.

In the exemplary embodiment, the converting unit 370 may use clocks 592 generated in a phased lock loop inside the external processor 22. When the converting unit 370 uses the clocks 592 generated in the phased lock loop inside the external processor 22, a sharp change is generated in the clocks 592 according to a use amount of a core of the external processor 22, and jitter is generated in the clocks 592, so that it is impossible to accurately make an analog signal. Jitter refers to the generation of transition in a normal clock, and when jitter is generated, it is impossible to accurately determine operation timing between the devices. However, when the converting unit 370 uses the clocks 582 generated in the phased lock loop inside the clock generating unit 400, it is possible to accurately make an analog signal. The phased lock loop performs a function of controlling an output signal by using a phase difference with signals fed back from an input signal and the output signal, and is for the purpose of adjusting a frequency of the output signal in accordance with the input signal.

The analog signal output unit 390 outputs the converted analog signal and transmits the analog signal to the amplifying unit 400.

The amplifying unit 400 includes a second power terminal unit 420, an analog signal input unit 440, an amp unit 460, and an amplification signal output unit 480.

The amplifying unit 400 serves to amplify the electric analog signal that is the output of the converter.

In the exemplary embodiment, the amplifying unit 400 may include a preamp adjusting an analog signal and a power amp amplifying power, and may be an integrated amp in which the preamp is combined with the power amp. The form of the amplifying unit 400 is not fixed, and may be changed according to the purpose and the function of the modular signal converting apparatus 10.

In another exemplary embodiment, the amplifying unit 400 may have a design optimized to the converter 300 for decreasing noise, and wires of an internal circuit of the amplifying unit 400 may have a maximum spaced structure in order to prevent overlapping of the portions in which digital noise may be induced. The description of the disposition of the spaced structure is as described above. The spaced distance may have a predetermined value or larger in consideration of a size and a playback sound quality of the final digital signal device.

The second power terminal unit 420 receives power from the power unit 100. However, the second power terminal unit 420 may receive power from an external power supply. Referring to FIGS. 2 and 13, the communicable external electric circuit 20 may have a separate power unit, and may supply power when the modular signal converting apparatus 10 is connected.

In the exemplary embodiment, the second power terminal unit 420 may receive power through a filter unit for decreasing power noise when receiving power, and the filter unit may have the same structure as those of the circuits of the power noise removing units 130, 150, and 170.

The analog signal input unit 440 may receive the electric analog signal output from the converter 300 through two channels.

In the exemplary embodiment, the analog signal input unit 440 may have the SPDIF interface structure of the clock input unit 240 and the data input unit 360 of the converter 300, and may decrease noise through the SPDIF digital interface structure.

The amplifying unit 460 performs a function of increasing power of an analog signal.

In the exemplary embodiment, the amplifying unit 460 may include an amplification signal output unit 480, and is formed of a plurality of OP-AMP devices to have a structure of increasing gains in stages. A gain of each OP-AMP device may have an optimized value in consideration of noise, and may have a feedback circuit including a resistance element between the respective amplifying devices.

The amplification signal output unit 480 outputs the amplified analog signal. This will be described with reference to FIG. 24. In the exemplary embodiment, left and right output channels of the amplification signal output unit 480 may have a structure of being surrounded by a ground (GND) 482 in order to avoid interference of the signal. The amplification signal output unit 480 uses cross talk as a reference for evaluating the degree of interference of the signals of the left and right output channels, and the cross talk means channel response and represents the degree of interference of the signals in the left and right channels of the amplification signal output unit 480. The amplification signal output unit 480 has the structure in which the left and right output channels are surrounded by the GND 482, thereby improving channel response.

The clock generating unit 500 generates the clock signals 582 and 592 which determine operation timing of the audio playback device that is the present invention. This will be described with reference to FIGS. 18 and 19.

The clock generating unit 500 generates a Master Clock (MCLK), a Left-Right Clock (LRCK), and a Bit Clock (BITCLK). The MCLK is a master clock and determines final operation timing of the digital signal device. The LRCK is a clock for a left (L) channel and a right (R) channel of a digital audio signal. When L-channel information is transmitted, the LRCK may be 1, and when R-channel information is transmitted, the LRCK may be 0. The BITCLK is a clock that is transmitted by interlocking with a bit that is the basis of a digital signal, and whether a digital signal is 0 or 1 is determined by synchronizing with the bit clock.

In the exemplary embodiment, the clock signals 582 and 592 generated in the clock generating unit 500 are input to the processor of the communicable external electric circuit and the converter 300. Since the clock generating unit 500 of the present invention uses the clock 582 made in the phased lock loop within the clock generating unit 500, unlike a general signal converting apparatus, it is possible to accurately make an analog signal. That is, the modular signal converting apparatus 10 directly makes and uses a clock therein, so that it is possible to make an analog signal with low jitter.

The mute unit 600 includes a primary mute unit 620, a secondary mute unit 640, and a tertiary mute unit 660.

The mute unit 600 performs a function of adjusting a high output. This will be described with reference to FIGS. 7 and 16.

For example, when the modular signal converting apparatus 10 is used as a hi-fi audio module, the mute unit 600 may be needed in order to control a high output. In the mute unit 600, mute input units 612 and 614 receive the signal of the amplification signal output unit 480 as an input and mute output units 662 and 664 transmit the tertiary muted signal to the connection unit.

In the exemplary embodiment, the mute unit 600 may include a plurality of mute units, and the number of mute units may be changed according to the output of the modular signal converting apparatus 10. The mute unit 600 may include a plurality of field effect transistor devices, and solve POP noise 672 leaking toward a negative part through a structure in which a source and a drain of the field effect transistor face each other. The POP noise 672 is noise generated when power is supplied or interrupted, and means noise generated by a voltage of a charged capacitor when a circuit including the capacitor having a charged voltage is connected with another electric circuit.

The primary mute unit 620 determines general mute timing. Referring to FIG. 20, the primary mute unit 620 may include a resistor, a capacitor, and a single field effect transistor. The number of electric devices of the primary mute unit is not fixed, and may be changed according to the output of the modular signal converting apparatus 10.

The secondary mute unit 640 and the tertiary mute unit 660 determine detailed timing of mute. Each of the secondary mute unit 640 and the tertiary mute unit 660 may include a plurality of resistors and a single capacitor. A drain voltage of the field effect transistor of each of the secondary mute unit 640 and the tertiary mute unit 660 may have a value optimized to an output power value of the modular signal converting apparatus 10.

FIG. 2 is a diagram illustrating an example of an application of the modular signal converting apparatus coupled to an electrically contactable external electric circuit according to the exemplary embodiment of the present invention. This will be described with reference to FIG. 13.

The modular signal converting apparatus 10 may be connected to the external electric circuit 20 including a contact part which is electrically contactable to the modular signal converting apparatus 10 including the processor 22, a memory 24, and a display unit 26.

The communicable external electric circuit 20 may further include other devices, other than the processor 22, the memory 24, and the display unit 26.

In the exemplary embodiment, the communicable external electric circuit 20 is electrically connected with the modular signal converting apparatus 10 and performs a function of transmitting a discrete signal. Further, the communicable external electric circuit 20 may include a connection unit which is mechanically contactable with the modular signal converting apparatus 10. Referring to FIGS. 14, 15, and 16, the external electric circuit 20 may output a high quality analog signal by using the modular signal converting apparatus 10. The communicable external electric circuit 20 may correspond to the electric circuit 50 inside the electronic component of the vehicle, an electric circuit 60 within a computer device, an electric circuit 70 within a video device, and an electric circuit 80 within a mobile device.

The processor 22 issues a command for transmitting the discrete signal stored in the memory 24 to the modular signal converting apparatus 10, receives the converted discrete signal from the modular signal converting apparatus 10, and performs a calculation process to perform a display function on the display 26.

For example, the processor 22 may be a Central Processing Unit (CPU) or a microprocessor. Referring to FIGS. 22 and 23, the processor 22 may receive the clock signals 582 and 592 and calculate and process the synchronized control signals 584 and 594 and the clock signals 582 and 592 as described above.

The memory 24 performs a function of storing a discrete signal for transmitting the discrete signal to the external modular signal converting apparatus 10 or the display 26.

In the exemplary embodiment, the memory 24 means a memory device or a storage device, and may include a hard disk drive, a solid state drive, and a Random Access Memory (RAM). Further, the memory 24 may also be fixed within the communicable external electric circuit 20, and may have a separable type, such as a portable drive.

The display 26 performs a function of outputting the signals calculated by the processor 22 in the form of a graphic image.

In the exemplary embodiment, the display 26 divides the graphic image into pixels and outputs the graphic image as a set of pixel values. The display 26 may receive an input from a user by a touch screen scheme, and may be a display including a liquid crystal display and an organic light-emitting diode device. Further, the display 26 may display a playback list of the audio playback device and a list of artists of digital contents.

Referring to FIG. 2, a horizontal or vertical length of the modular signal converting apparatus 10 may be 7 mm to 30 mm. In case of need, a size may be changed, and the size may be changed according to a standard of the connection unit of the external electric circuit 20.

FIG. 3 is an enlarged block diagram of a power unit in the exemplary embodiment of FIG. 1. This will be described with reference to FIG. 4.

The power unit 100 includes the plurality of power supply units 120, 140, and 160 and the plurality of noise removing units 130, 150, and 170.

The power supply units 120, 140, and 160 generate electric energy through a physical or chemical action. In the exemplary embodiment, the power supply units 120, 140, and 160 may use a potential difference caused by an ionization difference of a metal. Further, the power supply units 120, 140, and 160 may have optimized predetermined voltage values for decreasing noise of the modular signal converting apparatus 10. The detailed matters for the power supply units 120, 140, and 160 are as described above.

The noise removing units 130, 150, and 170 perform functions of removing noise induced by the power unit 100. The noise removing units 130, 150, and 170 may have a circuit structure in which electric devices are sequentially connected. The structure of the noise removing unit is as described above.

FIG. 4 is a circuit diagram of the noise removing unit in which electric devices located inside the power unit are sequentially disposed in the exemplary embodiment of FIG. 1. This will be described with reference to FIG. 3.

Internal circuits of the noise removing units 130, 150, and 170 include a voltage input node 172, a voltage output node 174, a Low Drop Out (LDO) regulator 154, and capacitors 152 and 156.

The voltage input node 172 is a part in which power is generated, and means output parts of the power supply units 120, 140, and 160, and the voltage output node 174 is a part from which the voltage, in which noise is removed, is output, and is connected with inputs of the first power terminal unit 320 and the second power terminal unit 420.

Reference numeral 132 is a graph illustrating a measurement of intensity of noise in the voltage input node 172. Reference numeral 134 is a graph illustrating a measurement of intensity of noise after noise is first removed. Reference numeral 136 is a graph illustrating a measurement of intensity of noise after noise is finally removed. The noise is removed in stages, so that the measurement voltage of the voltage output node 174 may have a smooth value.

FIG. 5 is a conceptual diagram of the connection unit in the exemplary embodiment of FIG. 1. This will be described with reference to FIG. 2.

The connection unit 200 includes the fastening unit 220 and the electrode 240. The connection unit 200 receives a discrete signal from the communicable external electric circuit 20 and transmits the discrete signal to the data input unit 360 of the converter 300, and transmits a signal of the amplification signal output unit 480 of the amplifying unit 400 to an external device. This will be described with reference to FIGS. 18 and 19.

In the exemplary embodiment, the connection unit 200 may transceive the clock signals 582 and 592 and the control signals 584 and 594 with the processor 22 within the communicable external electric circuit 20, and may include an insulating material in order to prevent an electric signal from flowing in the air or in a body of a user. A structure and a shape of the connection unit 200 may be changed according to the purpose of the communicable external electric circuit 20.

The fastening unit 220 enables the modular signal converting apparatus 10 to be mechanically mounted to the communicable external electric circuit 20.

In the exemplary embodiment, the fastening unit 220 may include a connector of a standardized standard. The fastening unit 220 may have a fastening structure using magnetic force for convenience of a user, and may have a general detachable fastening structure. Further, a material of the fastening unit 220 may include an insulating material for preventing an electric signal from leaking.

The electrode 240 enables an electric signal to be transceived between the modular signal converting apparatus 10 and the external electric circuit 20. This will be described with reference to FIGS. 9, 18, and 19.

In the exemplary embodiment, the electrode 240 may be a passage of the discrete signal, the contact signal, and the clock signals 582 and 592, and may include a plurality of electrodes.

The structure and the operation contents of the electrode 240 are as described above.

FIG. 6 is a diagram of an example of the fastening unit and the electrode in the exemplary embodiment of FIG. 1.

The connection unit 200 includes the fastening unit 220 and the electrode 240.

The description of the connection unit 200 is as described above.

The description of the fastening unit 220 is as described above.

The electrode 240 includes the guide shaft 242 and the guide ball 244.

In the exemplary embodiment, the guide shaft 242 may include an insulation material so as to be electrically separated from the guide ball 244 in which an electric signal flows. The guide ball 244 is in contact with the electric circuit when is pressurized with larger force than elastic force of a spring and performs a function of transceiving an electric signal. The guide ball 244 may include a conductive material, such as gold, silver, copper, and platinum. The shapes of the fastening unit 220 and the electrode 240 are not limited to the shape of FIG. 6, and may have various standards connectable to the communicable external electric circuit 20, in addition to the shape of FIG. 6.

FIG. 7 is an enlarged block diagram of the converter in the exemplary embodiment of FIG. 1.

The converter 300 includes the first power terminal unit 320, the clock input unit 340, the control signal receiving unit 380, the data input unit 360, the converting unit 370, and the analog signal output unit 390.

The matters for the first power terminal unit 320, the clock input unit 340, the control signal receiving unit 380, the data input unit 360, the converting unit 370, and the analog signal output unit 390 are as described above. Referring to FIGS. 18 and 19, the clock input unit 340 may receive three types of clock signals 582 and 592 generated in the clock generating unit 500. The description for the clock signals 582 and 592 is as described above.

In the exemplary embodiment, the analog signal output unit 390 outputs the converted analog signal. The analog signal output unit 390 includes a total of four channels including two right channels and two left channels. The converting unit 370 and the analog signal output unit 390 may be executed in one device, and accordingly, the converting unit 370 may perform a function of outputting an amplified signal.

FIG. 8 is an enlarged block diagram of the amplifying unit in the exemplary embodiment of FIG. 1. This will be described with reference to FIG. 2.

The amplifying unit 400 includes the second power terminal unit 420, the analog signal input unit 440, the amp unit 460, and the amplification signal output unit 480.

The matters for the second power terminal unit 420, the analog signal input unit 440, the amp unit 460, and the amplification signal output unit 480 are as described above.

In the exemplary embodiment, the second power terminal unit 420 may receive power from the power unit 100, or receive power from the communicable external electric circuit 20 including a separate power unit. The amplifying unit 400 may have a structure of being surrounded with the GND in order to decrease an interference of the signals in the left and right output channels of the amplification signal output unit 480.

FIG. 9 is an enlarged block diagram of the mute unit in the exemplary embodiment of FIG. 1.

The mute unit 600 includes the primary mute unit 620, the secondary mute unit 640, and the tertiary mute unit 660. Referring to FIGS. 7 and 16, the primary mute unit 620, the secondary mute unit 640, and the tertiary mute unit 660 may have a circuit structure of FIG. 16.

The primary mute unit 620 primarily performs a mute function, the secondary mute unit 640 receives the signal muted in the primary mute unit 620 as an input and performs the secondary mute function and then transmits the signal to the tertiary mute unit 660, and the tertiary mute unit 660 includes two left and right output channels and performs a final mute function. The details are as described above. The mute unit 600 may include an additional mute unit according to an output of the modular signal converting apparatus 10.

FIG. 10 is a diagram of an example of a housing and a shield can inside the modular signal converting apparatus according to the exemplary embodiment of the present invention.

The modular signal converting apparatus 10 includes the power unit 100, the converter 300, and the amplifying unit 400, and includes a housing 700 and a shield can 800 which are located outside the power unit 100, the converter 300, and the amplifying unit 400 and surrounding the power unit, the converter 300, and the amplifying unit 400.

The housing 700 is located outside one or more devices of the power unit 100, the converter 300, the amplifying unit 400, the clock generating unit 500, or the mute unit 600, thereby fixing the devices and performing a function like that of the shield can 800 at the same time.

For example, the housing 700 may include a detachable connection unit to be connected with the shield can 800, and the description of the material of the housing 700 is as described above. Further, in the housing 700, in order for the modular signal converting apparatus 10 to be in electrical contact with the external electric circuit 20, at least a part of the connection unit 200 may be exposed to the outside.

The shield can 800 performs a function of blocking an inflow of radiated noise.

In the exemplary embodiment, the shield can 800 may include a material including at least one of nickel silver or stainless, and may be used in order to prevent an inflow of radiated noise between the internal devices.

FIG. 11 is a conceptual diagram illustrating an external appearance of the modular signal converting apparatus according to the exemplary embodiment of the present invention. This will be described with reference to FIG. 1.

In the exemplary embodiment, an external appearance and an internal block diagram of a modular signal converting apparatus 1000 may be changed according to a characteristic and a purpose of the communicable external electric circuit. The modular signal converting apparatus 1000 is a set of modular signal converting devices performing predetermined functions, and includes a power unit, a connection unit, a converter, an amplifying unit, a clock generating unit, and a mute unit. The modular signal converting devices within the modular signal converting apparatus 1000 may correspond to reference numerals 1100, 1200, 1300, 1400, 1500, and 1600 of FIG. 11. The number of devices within the modular signal converting apparatus 1000 may be changed, and functions of the blocks indicated by reference numerals 1100, 1200, 1300, 1400, 1500, and 1600 may also be changed.

In the modular signal converting apparatus 1000, through the modulation of the signal converting devices, the system is freely changed, such as a change and replacement of the modularized signal converting device, according to a user's request. General users, manufacturers who want to enhance audio systems, home appliances, and electronic components for a vehicle, and the like, using the modular signal converting apparatus 1000 may tune the signal converting device by themselves at low cost and have the same effect as having an audio playback device of various lineups.

FIG. 12 is a conceptual diagram for modularization of the devices inside a modular signal converting apparatus according to the exemplary embodiment of the present invention. This will be described with reference to FIGS. 1 and 2.

A modular signal converting apparatus 2000 in which internal devices 2300 and 2400 may be modularized includes a base module 2600 and internal device modules 2300 and 2400.

In the exemplary embodiment, the modular signal converting apparatus 2000 may be modularized itself like the modular signal converting apparatus 10 as a matter of course, and the internal devices may also be modularized. The modular signal converting apparatus 2000 may include a total of three modules by modularizing the base module 2600 which may include a power unit 100, a connection unit 200, and the like, and a detachable converter 300 and amplifying unit 400. That is, a user may select a playback sound quality of various digital contents through the modularization of the internal devices, as well as the modularization of the modular signal converting apparatus 10 itself.

The base module 2600 may include the power unit 100, the connection unit 200, and the like, and is a main module in the modular signal converting apparatus 2000 and may have a function other than a function of the modularized device.

FIG. 13 is a conceptual diagram illustrating the case where the modular signal converting apparatus according to the exemplary embodiment of the present invention is in contact with an electric circuit inside an electronic component of a vehicle. This will be described with reference to FIG. 2.

The electric circuit 50 inside the electronic component of the vehicle transmits a discrete signal requiring conversion to the modular signal converting apparatus 10, and receives the converted analog signal and outputs the received analog signal within the vehicle.

In the exemplary embodiment, the electric circuit 50 inside the electronic component of the vehicle may correspond to the communicable external electric circuit 20, and the electric circuit 50 inside the electronic component of the vehicle may include the connection unit electrically connectable with the processor 22, the memory 24, the display unit 26, and the modular signal converting apparatus 10.

For example, a size and a standard of the modular signal converting apparatus 10 may be changed according to a standard of the electric circuit 50 inside the electronic component of the vehicle, and vehicle manufacturers who want to enhance electronic components may promote the improvement of a sound quality in a digital signal device, especially, the audio playback device, at low cost by using the modular signal converting apparatus 10.

FIG. 14 is a conceptual diagram illustrating the case where the modular signal converting apparatus according to the exemplary embodiment of the present invention is mounted to an electric circuit within a computer device. This will be described with reference to FIG. 2.

An electric circuit 60 inside a computer device transmits a discrete signal requiring conversion to the modular signal converting apparatus 10, and receives the converted analog signal and outputs the received analog signal.

In the exemplary embodiment, the electric circuit 60 inside the computer device may correspond to the communicable external electric circuit 20, and the electric circuit 60 inside the computer device may include a connection unit electrically connectable with the processor 22, the memory 24, the display unit 26, and the modular signal converting apparatus 10.

The description for the modular signal converting apparatus 10 is as described above.

FIG. 15 is a conceptual diagram illustrating the case where the modular signal converting apparatus according to the exemplary embodiment of the present invention is mounted to an electric circuit within a video device. This will be described with reference to FIG. 2.

An electric circuit 70 inside a video device transmits a discrete signal requiring conversion to the modular signal converting apparatus 10, and receives the converted analog signal and outputs the received analog signal. The discrete signal may be digital contents, and a user may listen to high quality digital contents by mounting the modular signal converting apparatus 10.

In the exemplary embodiment, the electric circuit 70 inside the video device may correspond to the communicable external electric circuit 20, and the electric circuit 70 inside the video device may include a connection unit electrically connectable with the processor 22, the memory 24, the display unit 26, and the modular signal converting apparatus 10.

The description for the modular signal converting apparatus 10 is as described above.

FIG. 16 is a conceptual diagram illustrating the case where the modular signal converting apparatus according to the exemplary embodiment of the present invention is mounted to an electric circuit within a mobile device. This will be described with reference to FIG. 2.

An electric circuit 80 inside a mobile device transmits a discrete signal requiring conversion to the modular signal converting apparatus 10, and receives the converted analog signal and outputs the received analog signal through a speaker of the mobile device and the like.

In the exemplary embodiment, the electric circuit 80 inside the mobile device may correspond to the communicable external electric circuit 20. The electric circuit 80 inside the video device may include a connection unit electrically connectable with the processor 22, the memory 24, the display unit 26, and the modular signal converting apparatus 10.

The description for the modular signal converting apparatus 10 is as described above.

When the modular signal converting apparatus 10 is in contact with the electric circuit 80 within the mobile device, the modular signal converting apparatus 10 may have the form of a chip, unlike the case where the modular signal converting apparatus 10 is in contact with the communicable external electric circuit 20.

FIG. 17 is a conceptual diagram of a user interface and graphic user interface (UI/GUI) which is changeable while being in linkage with the modular signal converting apparatus according to the exemplary embodiment of the present invention.

The descriptions of the communicable external electric circuit 20, the processor 22, the memory 24, and the display 26 are as described above.

In the exemplary embodiment, a UI/GUI environment displayed on the display 26 may be changed in accordance with the user's preference in linkage with a unique ID of the modular signal converting apparatus 10, and a color of a UI may be changed according to contents of a discrete signal received from the external electric circuit 20 and a picture of an artist may be changed according to the kind of music when the discrete signal is audio data on a screen of the display 26. The linkage may be implemented by simply changing hardware, and may be implemented by software.

In the exemplary embodiment, the modular signal converting apparatus 10 may be manufactured and delivered by itself in combination with a UI and a GUI, and the module itself may be licensed to create demand as a new business model.

FIG. 18 is a flowchart of a modular signal converting method according to an exemplary embodiment of the present invention. This will be described with reference to FIGS. 1, 2, and 19.

A modular signal converting method includes operations below performed by the modular signal converting apparatus in time series.

In S200, it is checked whether the modular signal converting apparatus 10 is electrically contacted with the communicable external electric circuit 20.

In the exemplary embodiment, in order to check whether the modular signal converting apparatus 10 is in normal contact with the external electric circuit 20, a contact signal and a reception signal may be used. The contact signal is a signal informing the communicable external electric circuit 20 that the modular signal converting apparatus 10 is in normal contact with the communicable external electric circuit 20, and the reception signal is a signal informing the modular signal converting apparatus 10 that the communicable external electric circuit 20 receives the contact signal and is ready to transmit a discrete signal in response to the contact signal. When the modular signal converting apparatus 10 is in normal contact with the communicable external electric circuit 20, the modular signal converting apparatus 10 may receive the discrete signal.

In S300, the converter 300 converts the discrete signal received from the communicable external electric circuit 20 into an analog signal and outputs the analog signal.

Details of the converter 300 are as described above.

In S400, the amplifying unit 400 amplifies the electric analog signal converted by the converter 300 and outputs the amplified analog signal. The details are as described above.

The modular signal converting apparatus 10 may further include an operation of receiving power and operation of being in electrical contact with an external device in order to perform the modular signal converting method.

FIG. 19 is an enlarged flowchart of the operation of checking in the exemplary embodiment of FIG. 18. This will be described with reference to FIGS. 2 and 18.

In S220, when the modular signal converting apparatus 10 is in normal contact with the communicable external electric circuit 20, the modular signal converting apparatus 10 transmits a contact signal. The description for the contact signal is as described above.

In S240, when the communicable external electric circuit 20 receives the contact signal, the communicable external electric circuit 20 transmits a reception signal informing that the communicable external electric circuit 20 is ready to transmit a discrete signal. An order of the operation for checking whether the modular signal converting apparatus 10 is in electrical contact with the communicable external electric circuit 20 may be changed as necessary.

FIG. 20 is a diagram of an example for a circuit structure of the mute unit according to the exemplary embodiment of the present invention. This will be described with reference to FIGS. 1 and 21.

The mute unit 600 performs a function of adjusting a high output of the modular signal converting apparatus 10.

In the exemplary embodiment, the mute circuit within the mute unit 600 includes input terminals 612 and 614 of the mute unit, output terminals 662 and 664 of the mute unit, a plurality of field effect transistors, a resistor, and a capacitor element. The input terminals 612 and 614 of the mute unit receive a signal output from the amplification signal output unit 480 as an input, and the output terminals 662 and 664 of the mute unit perform a function of outputting the muted amplified signal and transmitting the amplified signal to the connection unit 200.

In the exemplary embodiment, the mute unit 600 may be formed of a configuration of dual field effect transistors unlike a general mute circuit having a configuration of a single FET, and it is possible to solve the POP noise 672 leaking to a negative part through the structure in which a source and a drain of the FET face. The POP noise 672,674 is noise generated when power is supplied or interrupted, and means noise generated by a voltage of a charged capacitor when a circuit including the capacitor having a charged voltage is connected with another electric circuit.

FIG. 21 is a diagram of a measurement of intensity of POP noise removed in the mute unit. This will be described with reference to FIGS. 1 and 20.

For example, in the modular signal converting apparatus which is not provided with the mute unit 600, noise 80 leaking toward a negative part may occur as illustrated in FIG. 20. The POP noise 672 and 674 may occur by a capacitor, such as a voltage changing element provided within a circuit, and may occur when power is supplied to a circuit or the supply of power is interrupted, or the circuit is connected with another electric circuit.

A vertical axis labeled 1 and 2 of FIG. 21 may mean an effective voltage value.

FIG. 22 is a conceptual diagram for synchronization by using the clock signal and the control signal of the processor according to the exemplary embodiment of the present invention. This will be described with reference to FIGS. 1, 2, and 23.

The processor 22 generates clock signals 592 and a synchronized control signal 594.

In the exemplary embodiment, the processor 22 may be located within the communicable external electric circuit 20. The processor 22 transmits a control signal for performing synchronization for determining final operation timing between devices including the converter 300. The description for the clock signal is as described above.

The description for the converter 300 is as described above.

In the exemplary embodiment, the converter 300 receives the clock signals 582 and 592 generated in the phased lock loop within the processor 22, and synchronizes the clock signals 582 and 592 with the control signal within the processor. The synchronization is to unify the reference time of the clock signals so that there is no time transition of the clock signals 592 which are referenced by the processor 22 and the converter 300. The synchronization means matching the operation time of the system, and may also mean matching the data on a database at the same time.

FIG. 23 is a conceptual diagram for a synchronization method of a clock signal and a control signal by using an internal phased lock loop according to the exemplary embodiment of the present invention. This will be described with reference to FIGS. 1 and 22.

The clock generating unit 500 performs a function of generating clock signals 582 and a control signal 584 for synchronization of the clock signals between the devices by using the internal phased lock loop and transmitting the clock signals 582 and the control signal 584 to the processor 22 and the converter 300. The description for the clock signal 582 is as described above.

The processor 22 receives the clock signals 582 and the control signal 584 from the clock generating unit 500, and transmits the control signal 584 for determining final operation timing between the devices to the converter 300.

The converter 300 receives the clock signals 582 from the clock generating unit 500, receives the control signal from the clock generating unit 500 and the processor 22, and converts a discrete signal to an analog signal.

In FIG. 23, a difference in a signal flow between the devices is that the clock signals 582 generated in the clock generating unit 500 are used, and the description of the advantage in the case where the converter 300 converts the discrete signal by using the clock signals 582 generated within the modular signal converting apparatus 10 is as described above.

FIG. 24 is an example of a circuit diagram having a structure in which the output channel of the amplifying unit is surrounded with ground. This will be described with reference to FIG. 1.

In the exemplary embodiment, the amplifying unit 400 may have a structure of being surrounded with the GND 482 in order to decrease an interference of the signals in the left and right output channels of the amplification signal output unit 480.

For example, the simplification signal output unit 480 includes two left and right output channels, and uses cross talk as a reference for evaluating the degree of interference of the signal. The cross talk means channel response, and as the channel response is higher, the output signal of the amplifying unit 400 receives less interference, thereby outputting a clear amplified signal.

Details of the GND 482 are as described above.

In the exemplary embodiment, the analog signal output unit 390 may have a structure of the GND 482 in the internal circuit, and each of the noise removing units 130, 150, and 170 may also have a structure of the GND 482 in the internal circuit.

An entirety or a part of the method of the exemplary embodiment of the present invention described above may be implemented in the form of a recording medium executable by a computer, such as a program module executed by a computer. Herein, a computer readable medium may be any available medium accessible by a computer, and includes all of the volatile and non-volatile media, and the separable and non-separable media. Further, the computer readable media may include computer storage media and communication media. The computer storage medium may include all of the volatile and non-volatile media and the separable and non-separable media implemented by a predetermined method or technology for storing information, such as a computer-readable command, a data structure, a program module, or other data.

Further, the entirety or a part of the method of the exemplary embodiment of the present invention described above includes commands executable by a computer, and may also be implemented with a computer program (or a computer program product) recorded in a medium. The computer program includes programmable machine commands processed by a processor, and may be implemented by a high-level programming language, an object-oriented programming language, an assembly language, a machine language, and the like. Further, the computer program may be recorded in a tangible computer readable recording medium (for example, a memory, a hard disk, a magnetic/optical medium, or a Solid-State Drive (SSD)).

Accordingly, the method according to the exemplary embodiment of the present invention may be implemented when the computer program described above is executed by a computing device. The computing device may include at least a part of a processor, a memory, a storage device, a high-speed interface connected to a memory and a high-speed expanded port, and a low-speed interface connected to a low-speed bus and a storage device. The components are connected with each other by using various buses, and may be mounted to a common mother board or mounted by different appropriate methods.

The exemplary embodiment of the present invention has been described for illustrative purposes, those skilled in the art will appreciate that various modifications, additions, and substitutions are possible, without departing from the scope and spirit of the invention as disclosed in the accompanying claims. Therefore, the exemplary embodiments disclosed in the present invention and the accompanying drawings are intended to illustrate the technical spirit of the present invention, not to limit the technical spirit of the present invention, and the scope of the present invention is not limited by the exemplary embodiment and the accompanying drawings. The scope of the present invention shall be construed on the basis of the accompanying claims in such a manner that all of the technical ideas included within the scope equivalent to the claims belong to the present invention.

The invention claimed is:

1. A modular signal converting apparatus which is combinable with an external electric circuit, the modular signal converting apparatus comprising:
   a power unit configured to supply power;
   a connection unit which is in electric contact with the external electric circuit;
   a converter configured to receive power from the power unit and convert a discrete signal transferred from the connection unit to an analog signal; and
   an amplifying unit configured to amplify the analog signal converted by the converter,
   wherein the power unit includes:
      a plurality of separated power supply units; and
      a plurality of separated noise removing units, which is connected to the separated power supply units, and has a structure in which electric elements for removing noise in stages are sequentially disposed,
   wherein the power unit blocks noise induced from the power supply unit through the noise removing unit and supplies power,
   wherein each of the noise removing units includes a primary noise removing unit, a secondary noise removing unit, a tertiary noise removing unit, and a quaternary noise removing unit,
   wherein one end of the primary noise removing unit is connected to a voltage input node, the other end of the primary noise removing unit is connected to one end of the secondary noise removing unit and one end of the tertiary noise removing unit,
   wherein the other end of the secondary noise removing unit is connected to ground,
   wherein the other end of the tertiary noise removing unit is connected to one end of the quaternary noise removing unit and a voltage output node, and
   wherein the other end of the quaternary noise removing unit is connected to the ground.

2. The modular signal converting apparatus of claim 1, wherein the connection unit includes:
   an electrode for an electric contact with the external electric circuit; and
   a fastening part for a mechanical combination with the electric circuit.

3. The modular signal converting apparatus of claim 2, wherein the fastening part is provided to be detachable from the external electric circuit by using magnetic force, and
   the housing is located outside the power unit, the converter, and the amplifying unit and surrounds the power unit, the converter, and the amplifying unit, and is provided so as to expose at least a part of the electrode to the outside.

4. The modular signal converting apparatus of claim 3, further comprising:
   a shield can which is located outside the power unit, the converter, the amplifying unit, and the housing and surrounds the power unit, the converter, the amplifying unit, and the housing in order to prevent an inflow of radiated noise, and
   wherein a material of the shield can includes at least one of nickel silver or stainless.

5. The modular signal converting apparatus of claim 2, wherein the electrode has a pin structure including a guide shaft operated with a spring and a guide ball transferring an electric signal into the guide shaft, and when the electrode is pressurized with force larger than elastic force of the spring, the guide ball is in contact with the electric circuit.

6. The modular signal converting apparatus of claim 1, further comprising:
   a housing which is located outside the power unit, the converter, and the amplifying unit and surrounds the power unit, the converter, and the amplifying unit,
   wherein the housing is provided so as to expose at least a part of the connection unit to the outside.

7. The modular signal converting apparatus of claim 6, wherein in the converter, an internal circuit wiring gap has a spaced structure having a predetermined distance or more in order to prevent a digital signal and an analog signal from overlapping.

8. The modular signal converting apparatus of claim 7, wherein the amplifying unit includes a plurality of output channels, and an internal circuit of the output channel has a structure in which each output channel is surrounded with a ground in order to reduce a signal interference phenomenon between the output channels.

9. The modular signal converting apparatus of claim 8, wherein each of the amplifying unit and the converter includes a filter for blocking noise generated in the power unit.

10. The modular signal converting apparatus of claim 1, wherein the converter receives a synchronized control signal and a clock signal from the external electric circuit, and converts the discrete signal to the analog signal by using the received control signal and clock signal.

11. The modular signal converting apparatus of claim 10, wherein the converter has an interface structure in which the clock signal and the discrete signal transferred from the connection unit are received through one cable, and the cable is at least one of a coaxial cable or an optical fiber cable, and
    the converter converts the discrete signal to the analog signal through the interface structure.

12. The modular signal converting apparatus of claim 1, further comprising:
    a clock generating unit configured to generate a clock signal determining operation timing of the modular signal converting apparatus,
    wherein the clock signal generated by the clock generating unit is input to a processor of the external electric circuit and the converter of the modular signal converting apparatus.

13. The modular signal converting apparatus of claim 1, further comprising:
    a mute unit configured to adjust an output of the modular signal converting apparatus,
    wherein the mute unit includes a first mute processing unit muting an audio signal at a time when negative pop noise is present based on a predetermined timing and a second mute processing unit muting the audio signal at a time when positive pop noise is present based on the timing,
    wherein the first mute processing unit is implemented as dual FETs including a first FET and a second FET, and the first FET and the second FET are arranged so that a drain and a source of the first FET and a drain and a source of the second FET face each other, and wherein the second mute processing unit is implemented as dual FETs including a third FET and a fourth FET, and the third FET and the fourth FET are arranged so that a drain and a source of the third FET and a drain and a source of the fourth FET face each other.

14. A modular signal converting method, comprising:
receiving power from a power unit inside a modular signal converting apparatus;
checking whether the modular signal converting apparatus is in electric contact with an external electric circuit;
receiving, by the modular signal converting apparatus, a discrete signal transferred from the external electric circuit and converting the discrete signal into an analog signal; and
amplifying the analog signal,
wherein the receiving of the power includes receiving power by removing noise induced from the power unit,
wherein the power unit includes:
    a plurality of separated power supply units; and
    a plurality of separated noise removing units, which is connected to the separated power supply units, and has a structure in which electric elements for removing noise in stages are sequentially disposed,
    wherein each of the noise removing units includes a primary noise removing unit, a secondary noise removing unit, a tertiary noise removing unit, and a quaternary noise removing unit,
    wherein one end of the primary noise removing unit is connected to a voltage input node, the other end of the primary noise removing unit is connected to one end of the secondary noise removing unit and one end of the tertiary noise removing unit,
    wherein the other end of the secondary noise removing unit is connected to ground,
    wherein the other end of the tertiary noise removing unit is connected to one end of the quaternary noise removing unit and a voltage output node, and
    wherein the other end of the quaternary noise removing unit is connected to the ground.

15. The modular signal converting method of claim 14, wherein the checking includes:
    in the case where the modular signal converting apparatus is in normal contact with the external electric circuit, transmitting a contact signal informing that the modular signal converting apparatus is ready to receive the discrete signal to the external electric circuit; and
    receiving, by the modular signal converting apparatus, a response signal to the contact signal from the external electric circuit, and
    when the modular signal converting apparatus receives the response signal, the modular signal converting apparatus receives the discrete signal from the external electric circuit.

16. The modular signal converting method of claim 15, wherein the converting further includes receiving a synchronized control signal and a clock signal from the external electric circuit, and
    the modular signal converting apparatus converts the discrete signal to the analog signal by using the synchronized control signal and the clock signal.

17. The modular signal converting method of claim 14, wherein the converting includes converting the discrete signal by using an internal circuit in which a wiring gap has a spaced structure having a predetermined distance or more, in order to prevent the discrete signal and the analog signal from overlapping.

* * * * *